(12) United States Patent
Masayuki et al.

(10) Patent No.: US 10,361,357 B2
(45) Date of Patent: Jul. 23, 2019

(54) PIEZOELECTRIC OXIDE SINGLE CRYSTAL SUBSTRATE

(71) Applicant: SHIN-ETSU CHEMICAL CO., LTD., Tokyo (JP)

(72) Inventors: Tanno Masayuki, Annaka (JP); Abe Jun, Annaka (JP); Kuwabara Yoshinori, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 421 days.

(21) Appl. No.: 15/307,151

(22) PCT Filed: Apr. 30, 2015

(86) PCT No.: PCT/JP2015/062931
§ 371 (c)(1),
(2) Date: Oct. 27, 2016

(87) PCT Pub. No.: WO2015/170656
PCT Pub. Date: Nov. 12, 2015

(65) Prior Publication Data
US 2017/0054068 A1    Feb. 23, 2017

(30) Foreign Application Priority Data

May 9, 2014   (JP) ................. 2014-097462
Nov. 5, 2014  (JP) ................. 2014-224931

(51) Int. Cl.
*H01L 41/187*   (2006.01)
*H01L 41/18*    (2006.01)
(Continued)

(52) U.S. Cl.
CPC .......... *H01L 41/1873* (2013.01); *H01L 41/18* (2013.01); *H03H 9/02559* (2013.01); *H03H 9/145* (2013.01); *H03H 9/25* (2013.01)

(58) Field of Classification Search
CPC . H01L 41/1873; H01L 41/18; H03H 9/02559; H03H 9/145; H03H 9/25
(Continued)

(56) References Cited

U.S. PATENT DOCUMENTS 6,652,644 B1    11/2003  Miller et al.
2011/0241479 A1*  10/2011  Koizumi ............... C04B 35/493
                                              310/311
(Continued)

FOREIGN PATENT DOCUMENTS

JP    2003-207671 A    7/2003
JP    2006-124223 A    5/2006
(Continued)

OTHER PUBLICATIONS

Office Action dated Jun. 2, 2016, issued in counterpart Taiwanese Patent Application No. 104114519. (4 pages).
(Continued)

*Primary Examiner* — Thomas M Dougherty
(74) *Attorney, Agent, or Firm* — Westerman, Hattori, Daniels & Adrian, LLP

(57) ABSTRACT

Disclosed is a piezoelectric oxide single crystal substrate used in a surface acoustic wave device and the like which undergoes scarce warpage and is not easy to break or get scratched and has good a temperature characteristic. A piezoelectric oxide single crystal substrate has a concentration profile such that the Li concentration differs between the substrate surface and a middle part of the substrate; in particular, the concentration profile is such that, in the direction of the thickness of the substrate, the closer the measuring point is to the substrate surface, the higher becomes the Li concentration, and the closer the measuring point is to the thickness-wisely middle part of the substrate, the lower becomes the Li concentration.

16 Claims, 10 Drawing Sheets

(51) Int. Cl.
*H03H 9/02* (2006.01)
*H03H 9/145* (2006.01)
*H03H 9/25* (2006.01)

(58) Field of Classification Search
USPC ........................................................ 310/358
See application file for complete search history.

(56) References Cited

U.S. PATENT DOCUMENTS

2017/0373245 A1* 12/2017 Abe .................. H01L 41/18
2018/0048283 A1*  2/2018 Tanno ................ H01L 41/18
2018/0294793 A1* 10/2018 Tanno ................ H03H 9/25

FOREIGN PATENT DOCUMENTS

| JP | 4220997 B2 | | 2/2009 | | |
|---|---|---|---|---|---|
| JP | 2011-135245 A | | 7/2011 | | |
| JP | 2013-066032 A | | 4/2013 | | |
| JP | 2013-66032 A | | 4/2013 | | |
| JP | 2013-236277 A | | 11/2013 | | |
| JP | 6174061 | * | 8/2017 | ............. | C30B 29/30 |
| WO | 2013/135886 A1 | | 9/2013 | | |
| WO | WO-2016/167165 | * | 10/2016 | ............. | C30B 31/02 |

OTHER PUBLICATIONS

International Search Report dated Jun. 16, 2015, issued in counterpart application No. PCT/JP2015/062931. (2 pages).

* cited by examiner

PIEZOELECTRIC OXIDE SINGLE CRYSTAL SUBSTRATE

TECHNICAL FIELD

The present invention relates to a piezoelectric oxide single crystal substrate used as a surface acoustic wave device or the like.

BACKGROUND ART

In recent years, the communication system for mobile phones supports multiple communication standards, and each of the communication standards has progressed to a form composed of a plurality of frequency bands. As a part of such mobile phone which performs frequency adjustment and selection, a piezoelectric substrate ("SAW": Surface Acoustic Wave) device, for example, is used, which is formed with a comb-shaped electrode for exciting the surface acoustic wave on a piezoelectric substrate.

Then, since this surface acoustic wave device is small and has low insertion loss and since it is required to be impervious to unnecessary waves, the piezoelectric materials such as lithium tantalate (LiTaO3, hereinafter also referred to as "LT") and lithium niobate (LiNbO3, hereinafter, also referred to as "LN") are used to make the surface acoustic wave device. In particular, the communication standard for the fourth generation mobile phones specifies in many cases a relatively narrow frequency band interval between send and receive communications and a relatively large band width; however, since the properties of the conventional materials used to make the surface acoustic wave device are variable with temperature, so that a problem that has occurred is that the frequency selection area is displaced with a result that the filter and duplexer functions are interfered. Therefore, materials that are less variable with respect to temperature, and has a relatively large band width are craved for as the material to make the surface acoustic wave device.

In the manufacturing process of the surface acoustic wave device, there are more than one steps where the raw material is subjecting to a temperature of 100-300° C., so that if there is pyroelectricity in the surface acoustic wave device material, the material can be charged at higher than 1 KV and discharge electricity. This discharge is not desirable because the manufacturing yield of the surface acoustic wave device decreases. Further, even if the pyroelectricity is so weak that the charging of the surface acoustic wave device material decreases with time, this is not desirable yet, because the noise is generated in the electrode of the surface acoustic wave device by the temperature change.

On the other hand, IP Publication 1 describes that the stoichiometric composition LT obtained mainly by the vapor phase method, using copper as the electrode material, is desirable since it causes it more difficult for the breakdown mode to occur in which the device is destroyed at the moment when the higher power is input to the IDT electrode. In IP Publication 2 there is a detailed description relating to the stoichiometric composition LT which is obtained by the vapor phase method. Further, IP Publication 5 and non-IP Publication 2 also contain a report saying that the use of a denatured LT, in which Li is enriched uniformly in the direction of thickness by means of vapor phase equilibrium method, as the material to make the surface acoustic wave device, is desirable since the frequency temperature behavior of the device is improved.

However, it was found that in the methods disclosed in these IP publications favorable results are not necessarily obtained. In particular, according to the method described in IP Publication 5, it takes no less than 60 hours at a high temperature of about 1300° C. for the wafer to be processed, because the processing is conducted in a gas phase, and as the result the high manufacturing temperature, consequent substantial warpage of the wafer, and high rate of crack generation lead to poor productivity and overly pushed-up price for a surface acoustic wave device material. Furthermore, the vapor pressure of $Li_2O$ is so low that depending on the distance from the Li source, the sample being denatured undergoes uneven denaturing whereby the properties similarly show uneven distribution and hence the industrialization of it requires significant improvement.

Further, IP Publication 5 teaches about a manufacturing condition comprising a substrate thickness of 0.5 mm t and a treatment temperature of 1200° C.-1350° C.; however this is none other than a time-honored conventional manufacturing procedure, and this thickness is far greater than that commonly required of the substrate for the surface acoustic wave device. It is conceivable to make the substrate thinner until it obtains a desired thickness after the vapor phase treatment; however since the diffusion of Li has caused some deformation in the substrate so that the rate of cracking during the thinning procedure is increased, and what is more, such operation adds to the manufacturing cost and it is economically irrational and a waste of material resulting from halving the 0.5-mm-thick substrate to 0.25-mm-thickness—an unjustifiable cause for heightening the price.

Moreover, in the course of the investigation by the present inventors with regard to the lithium tantalate single crystal substrate for surface acoustic wave element described in IP Publication 5, they found that the substrate had weak pyroelectricity, and consequently they conducted procedures so as to remove this pyroelectricity, and in one example they adopted the method taught in the description of IP Publication 6, but it was impossible to completely remove the pyroelectric effect.

Then, IP Publication 3 discloses a manufacturing method wherein $LiNbO_3$ and $LiTaO_3$ are subjected to a proton exchange treatment to thereby create a refractive index distribution in the surface layers of $LiNbO_3$ and $LiTaO_3$ or the like. But once the proton exchange is effected, the piezoelectric property of the materials such as $LiNbO_3$ and $LiTaO_3$ is impaired and as the result there occurs a problem that they cannot be used as a material for surface acoustic wave device.

In addition, Non-IP Publication 1 teaches that a 38.5° rotation Y cut $LiTO_3$ having a fixed ratio composition (hereinafter also referred to as "stoichiometry composition LT or SLT") which is obtained by the pulling method employing a double crucible, is more preferable compared to the one having a melt composition of $LiTaO_3$ (hereinafter also referred to as "congruent composition LT, or CLT") which is obtained by the usual pulling method wherein the compositions of the melt and that of the raised crystal are identical to each other, for the reason that the electromechanical coupling factor of the former is 20% higher than the latter. However, in the case of the LT of non-IP Publication 1, the pulling speed to obtain the SLT has to be one order lower than that with the usual pulling method, so that the cost of the SLT becomes so high that it is difficult to use it in the application for surface acoustic wave device.

PRIOR ART PUBLICATIONS

Non-IP Publications

[Non-IP Publication 1]
"Practical Use and Development of the Opto-Media Crystallization to Support IT" Technology Promotion Adjustment Costs Result Report, 2002, Kenji Kitamura
[Non-IP Publication 2]
Bartasyte, A. et. al, "Reduction of temperature coefficient of frequency in LiTaO3 single crystals for surface acoustic wave applications" Applications of Ferroelectrics held jointly with 2012 European Conference on the Applications of Polar Dielectrics and 2012 International Symp Piezoresponse Force Microscopy and Nanoscale Phenomena in Polar Materials (ISAF/ECAPD/PFM), 2012 Intl Symp, 2012, Page(s):1-3

IP PUBLICATIONS

[IP Publication 1]
Japanese Patent Application Publication 2011-135245
[IP Publication 2]
U.S. Pat. No. 66,526,644(B1)
[IP Publication 3]
Japanese Patent Application Publication 2003-207671
[IP Publication 4]
Japanese Patent Application Publication 2013-66032
[IP Publication 5]
WO2013/135886
[IP Publication 6]
Japanese Patent No. 4220997

SUMMARY OF THE INVENTION

Problems the Invention Seeks to Solve

The present invention was contrived in view of the above-described circumstances, and therefore it is an object of the present invention to provide a piezoelectric oxide single crystal substrate used in surface acoustic wave device which has good temperature characteristic, undergoes scarce warpage and is not easy to break or get scratched.

The inventors studied and experimented hard to attain the above-mentioned object, and found that if a substrate of a roughly congruent composition is subjected to a gas phase treatment to receive Li diffusion in it in a manner such that the resultant Li concentration profile in the thickness direction would show that Li concentration becomes higher as the measurement point approaches the surface of the substrate and it becomes lower as the measurement point approaches a middle part of the substrate, then thus denatured substrate will make such a piezoelectric oxide single crystal substrate that is favorable for surface acoustic wave device because it has good temperature characteristic, undergoes scarce warpage and is not easy to break or get scratched, just like the conventional denatured substrate whose crystal structure has uniform profile of Li concentration throughout the entire body including the middle part; hence the inventors realized that it was not necessary to conduct thorough denaturing with Li diffusion and thus possessed the invention.

Means to Solve the Problems

Accordingly, the present invention proposes a piezoelectric oxide single crystal substrate characteristic in that it has a Li concentration profile plotted against substrate thickness such that the concentration at the surface of the substrate is different from that at an inner part of the substrate. This thickness-wise concentration profile is preferably such that Li concentration becomes higher as the measurement point approaches the surface of the substrate and it becomes lower as the said point approaches the innermost part of the substrate; furthermore, it is preferable that this thickness-wise concentration profile extends from the surface of the substrate to a depth of 70 µm.

Also, the piezoelectric oxide single crystal substrate of the present invention is preferably characteristic in that the composition in the range between the substrate surface and a depth at which the Li concentration starts decreasing or at which it stops increasing is of pseudo stoichiometric, and that the composition in the thickness-wisely middle part is of roughly congruent. And it is preferable that the depth at which the Li concentration starts increasing or the depth at which the Li concentration stops decreasing is deeper than 5 µm from the surface of the substrate as measured in the thickness direction.

Furthermore, the piezoelectric oxide single crystal substrate of the present invention is characteristic in that it has a profile such that the surface of the substrate and the inner part of the substrate have different values of the half-value width of Raman shift peak. It is also a characteristic that the profile of the half-value width of Raman shift peak is such that in the thickness direction the closer the measuring point is to the substrate surface, the smaller the value of the half-value width of Raman shift peak becomes, and the closer the measuring point is to the middle part of the substrate, the greater the value of the half-value width becomes, and that the difference between the value of the half-value width of Raman shift peak at the substrate surface and that in the thickness-wisely middle part of the substrate is 1.0 $cm^{-1}$ or greater.

When piezoelectric oxide single crystal substrate material of the present invention is a lithium tantalate single crystal, it is preferable that the value of the half-value width of Raman shift peak near 600 $cm^{-1}$ at the substrate surface is 6.0-8.3 $cm^{-1}$, and that when the material of the substrate is lithium niobate single crystal, the half-value width of the Raman shift peak near 876 $cm^{-1}$ at the substrate surface is 17.0-23.4 $cm^{-1}$.

Piezoelectric oxide single crystal substrate of the present invention is characteristic in that it has a multi-domain structure, where polarization directions are not oriented in one direction, in the vicinity of the thickness-wisely middle position, and that it does not show pyroelectric nature at its surface. Further, the substrate is characteristic in that a zero voltage waveform is induced when a vertical vibration is given in the thickness direction to the principal surface or the back surface of the substrate, and that a voltage waveform exhibiting piezoelectricity is induced when a vibration in the shearing direction is given to the principal surface or the back surface of the substrate.

Also, the piezoelectric oxide single crystal substrate of the present invention has a Y-cut crystal orientation at the rotation angle of 36-49°, a thickness of 0.2 mm through 0.4 mm, and a warpage of 100 µm or less. Now, the piezoelectric oxide single crystal substrate of the present invention as described above is manufactured by effecting a gas-phase Li diffusion from the surface to the inside of an oxide single crystal substrate of a roughly congruent composition already subjected to a single polarization treatment.

Effects of the Invention

According to the present invention, it is possible to provide a piezoelectric oxide single crystal substrate for use in a surface acoustic wave device which substrate will have reduced warping and will incur no crack or scratch, and will have good temperature characteristic.

EXAMPLES TO EMBODY THE INVENTION

Figure 1:
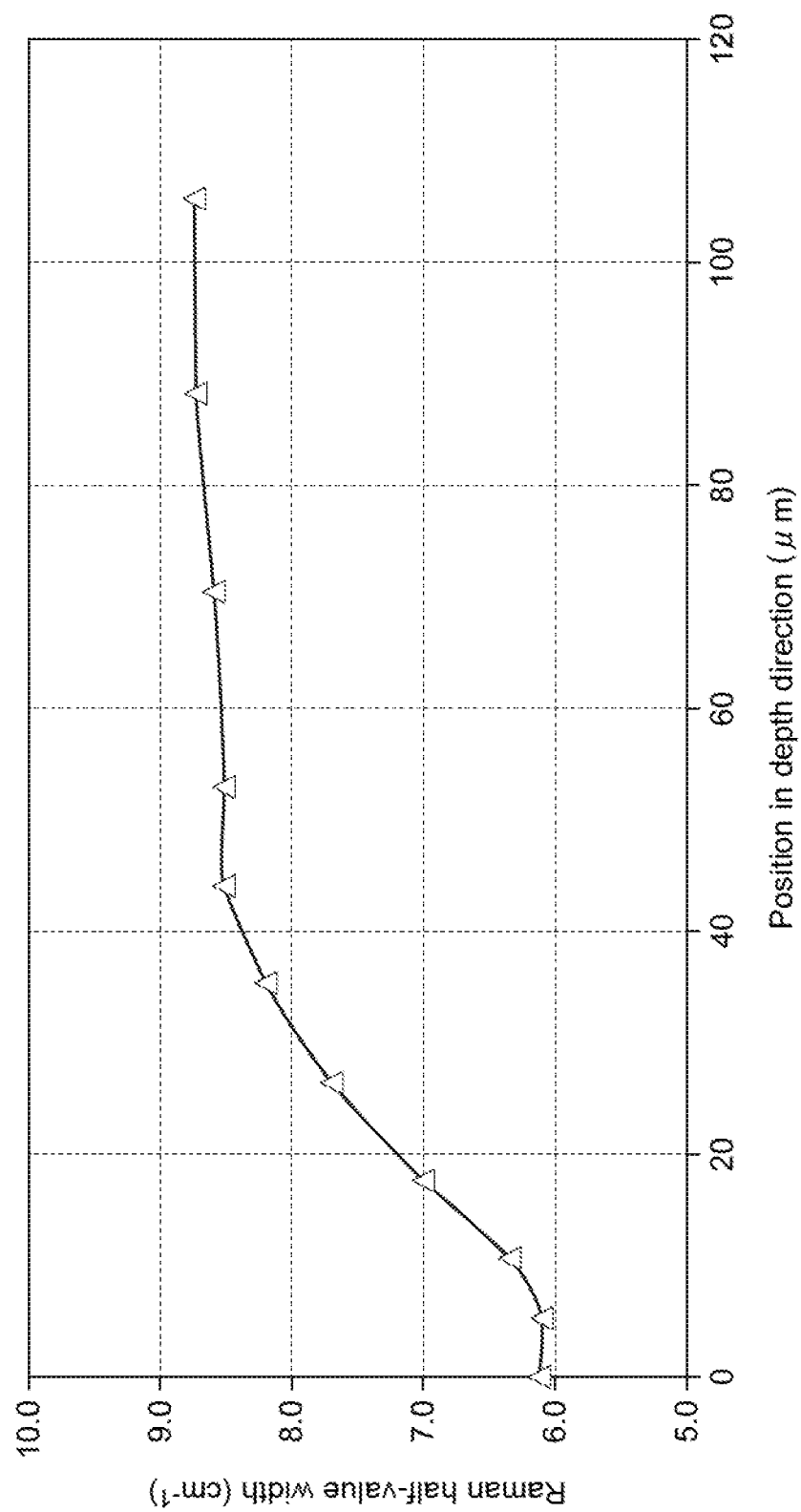
FIG. 1 shows a Raman profile of a lithium tantalate single crystal substrate obtained in Example 1.

Hereinafter we will describe embodiments in detail, but the present invention is not limited to these embodiments.

As the piezoelectric oxide single crystal substrate material of the present invention, a lithium compound such as lithium tantalate, lithium niobate, and lithium tetraborate are possible. Further, the piezoelectric oxide single crystal substrate of the present invention is intended to be used chiefly as a substrate for a surface acoustic wave device, and it may be used alone or as a part of a composite substrate formed by combining it with other materials.

Piezoelectric oxide single crystal substrate of the present invention is characteristic in that it has a Li concentration profile in which the Li concentration at the substrate surface differs from that at the inner part of the substrate. Furthermore, it is preferable, from the viewpoint of simplicity of manufacturing, for the substrate to have a region in which the Li concentration becomes higher as the measurement point approaches, in the thickness direction, the surface of the substrate and it becomes lower as the measurement point approaches the innermost part of the substrate.

Here, the "concentration profile" refers to a continuous curve representing a change in concentration. A substrate having a region in which the Li concentration has such a profile as described above can be obtained with ease by diffusing Li through the surface of the substrate. A substrate wherein the Li concentration changes discontinuously is conceivably obtainable, for example, by joining substrates having different Li concentration; however, this will complicate the manufacturing process and will push up costs of installations, etc.

Also, the piezoelectric oxide single crystal substrate of the present invention is preferably such that the composition in the range between the substrate surface and the depth at which the Li concentration starts decreasing or the composition in the range between the other substrate surface and the depth at which the Li concentration stops increasing is pseudo stoichiometric composition, for such substrate would show excellent temperature characteristic. In a case where the Li concentration starts decreasing immediately from the substrate surface, the afore-said "range between the substrate surface and the depth at which the Li concentration starts decreasing" is identical to the substrate surface.

The term "pseudo stoichiometric composition," for the purpose of this invention, is a composition which differs depending on the material, and in the case of lithium tantalate single crystal substrate, for example, the pseudo stoichiometric composition is a composition such that $0.490<Li/(Li+Ta)<0.510$, and in the case of lithium niobate single crystal substrate it is such that $0.490<Li/(Li+Nb)<0.510$. In the cases of other materials also, the "pseudo stoichiometric composition" can be defined in the similar manner based on the common sense of the technology.

Further, thickness-wisely middle part of the piezoelectric oxide single crystal substrate of the present invention is preferably of roughly congruent composition. The reason for this it that, as indicated in the examples shown below, when the Li diffusion treatment is applied to the surface of the substrate of roughly congruent composition, and if the thickness-wisely middle part of the substrate is made to have roughly congruent composition, then the temperature required to do this heat treatment is lower and the time required to do this is shorter as compared to the case where the entire substrate is rendered to have pseudo stoichiometric composition, and as a result it becomes possible to prevent the substrate from warping, cracking, or being scratched, whereupon it is possible to improve the productivity.

Here, "thickness-wisely middle part of the substrate" means a part which corresponds to that part of the Li concentration profile that lies between a position where the Li concentration starts increasing and a position which marks ½ of the substrate thickness. In this range it is possible for the Li concentration to increase or decrease at more moderate rates than in the case of the range which indicates the Li concentration profile. Also, it is not necessary for the composition to be roughly congruent throughout this range, but it suffices that the roughly congruent composition occurs at any part of the range.

Also, the "roughly congruent composition" can differ depending on the material, and in the case where the congruent composition of a lithium tantalate single crystal substrate, for example, is such that $Li/(Li+Ta)=0.485$, then a roughly congruent composition shall be such composition that satisfies $0.475<Li/(Li+Ta)<0.495$; also if the congruent composition of lithium niobate single crystal substrate is such that $Li/(Li+Nb)=0.485$, then a roughly congruent composition shall be such composition that satisfies $0.475<Li/(Li+Nb)<0.495$. In the case of other materials also, the "roughly congruent composition" can be defined in the similar manner based on common sense of the technology.

Now, in the case of the above example of the lithium tantalate single crystal substrate, if a composition is such that the ratio Li/(Li+Ta) falls between 0.490 and 0.495, then such composition is "pseudo stoichiometric composition" as well as "roughly congruent composition"; however, to evaluate the composition in "the range between the substrate surface and a depth at which the Li concentration starts decreasing," the definition of "pseudo stoichiometric composition" can be used, and to evaluate the composition in "the thickness-wisely middle part" the definition of "pseudo stoichiometric composition" can be used. In the case of lithium niobate single crystal substrate or other materials similar approach can be adopted.

Also, in the piezoelectric oxide single crystal substrate of the present invention, the range in which the Li concentration shows a varying profile preferably lies from the substrate surface through a depth of 70 μm as measured in the thickness direction. If there occurs a varying profile of Li concentration throughout this range, it is possible to obtain such temperature characteristic in the substrate that is sufficient for practical purposes and at the same time the possibility of the substrate incurring warpage, cracking, and scratch is minimized.

Furthermore, it is preferable that, in the Li concentration profile, that position at which the Li concentration starts increasing or that position at which the Li concentration stops decreasing is deeper than 5 μm from the substrate surface in the thickness direction. For, if the position at which the Li concentration starts increasing is shallower than the said depth, it is feared that the SAW response property would be degraded.

For a method to evaluate the composition of a piezoelectric oxide single crystal substrate, well-known methods such as the Curie thermometry can be used, while a local composition can be evaluated nondestructively by using Raman spectroscopy.

With respect to lithium tantalate single crystal and lithium niobate single crystal, it is known that there exists a roughly linear relationship between the half-value width of Raman shift peak and the Li concentration [value of Li/(Li+Ta)] (ref. 2012 IEEE International Ultrasonics Symposium Proceedings, Page (s):1252-1255, Applied Physics A 56, 311-315 (1993)). Therefore, it should be possible to evaluate the composition at any position in an oxide single crystal substrate by using an equation representing such linear relationship.

An equation representing the relationship between half-value width of Raman shift peak and the Li concentration can be obtained, if the values of Raman half-value widths of several samples whose compositions are known and whose Li concentrations are not the same were measured; however, it is possible to use a relationship equation that is publicized in literatures, so long as identical conditions are adopted in conducting Raman measurement method. For example, in the case of lithium tantalate single crystal, following Equation (1) may be used (ref. 2012 IEEE International Ultrasonics Symposium Proceedings, Page(s):1252-1255); for lithium niobate single crystal, one can use either Equation (2) or Equation (3) shown below (ref. Applied Physics A 56, 311-315(1993)).

$$Li/(Li+Ta)=(53.15-0.5FWHM_1)/100 \quad (1)$$

$$Li/(Li+Nb)=(53.03-0.4739FWHM_2)/100 \quad (2)$$

$$Li/(Li+Nb)=(53.29-0.1837FWHM_3)/100 \quad (3)$$

Here, $FWHM_1$ is the half-value width of Raman shift peak in the vicinity of 600 cm$^{-1}$, $FWHM_2$ is the half-value width of Raman shift peak in the vicinity of 153 cm$^{-1}$, and $FWHM_3$ is the half-value width of Raman shift peak in the vicinity of 876 cm$^{-1}$. For the details of the measurement conditions, please refer to the cited publications.

The piezoelectric oxide single crystal substrate of the present invention is also characteristic in that it has a profile of Raman shift peak half-value width in which the value of the half-value width at the substrate surface differs from that in the middle part of the substrate. It is preferable that the substrate has a range extending in the thickness direction in which the closer the measuring point is to the substrate surface, the smaller does the value of the Raman shift peak half-value width becomes, and closer the measuring point is to the middle part of the substrate is, the greater the value of the half-value width becomes.

It is also preferable that, in the piezoelectric oxide single crystal substrate of the present invention, the difference between the Raman half-value width value at the substrate surface and that at the thickness-wisely middle part of the substrate is 1.0 cm$^{-1}$ or greater. In this way, as is shown in publicly known examples and in the examples that are described below, it becomes possible to conduct the treatment at lower temperature and in shorter time than in the case of a substrate wherein the value of the Raman half-value width is roughly constant in the range extending thickness-wise from the substrate surface to the middle part of the substrate; and as the result it becomes possible to minimize the warpage, cracks, and scratches of the substrate and to improve the productivity.

Now, in the case where the value of the Raman half-value width is not constant in the thickness-wisely middle part of the substrate, it is not necessary for all the values measured in this part to satisfy the condition that their respective difference from the Raman half-value width value measured at the substrate surface is 1.0 cm$^{-1}$ or greater, but it suffices if any value among them satisfies the above-mentioned condition.

In particular, in the lithium tantalate single crystal substrate of the present invention, it is preferable that the value of the half-value width of Raman shift peak in the vicinity of 600 cm$^{-1}$ is 6.0-8.3. If the Raman half-value width value is roughly 6.0-6.6, then Li/(Li+Ta) becomes about 0.500 so that this brings about an especially good temperature characteristic. Also, if the value of the Raman half-value width value is 6.0-8.3 at the substrate surface, then it is possible to judge that at least the substrate surface is modified (denatured) to pseudo stoichiometric composition, and thus, compared to a lithium tantalate single crystal substrate of congruent composition, it would exhibit a better temperature characteristic.

Also, in the lithium niobate single crystal substrate of the present invention, it is preferable that the value of the half-value width of Raman shift peak in the vicinity of 876 cm$^{-1}$ is 17.0-23.4. If the value of Raman half-value width is roughly 17.0-18.8, then Li/(Li+Nb) becomes about 0.500 so that this brings about an especially good temperature characteristic. Also, if the value of the Raman half-value width is 17.0-23.4 at the substrate surface, then it is possible to judge that at least the substrate surface is modified to pseudo stoichiometric composition, and thus, compared to a lithium niobate single crystal substrate of congruent composition, it would exhibit a better temperature characteristic.

The warpage of the piezoelectric oxide single crystal substrate of the present invention can be evaluated by methods such as laser beam interference method. The smaller the warpage of the substrate is, the better it is;

however when the warpage is 100 μm or smaller, the substrate can be sufficiently usable in industry.

The piezoelectric oxide single crystal substrate of the present invention exhibits piezoelectricity, even when it has not received polarization process, and thus can be used as a substrate for surface acoustic wave device, as it is. In this state, the piezoelectric oxide single crystal substrate of the present invention has, in the vicinity of its thickness-wisely middle position, a multi-domain structure, where the polarization directions are not oriented in one direction. In the case in which the polarization process is conducted upon the substrate of the present invention, it can also be used as a substrate for surface acoustic wave device, but the properties of the substrate are modified. Therefore, whether to conduct the polarization process or not is determined arbitrarily depending on the properties required of the substrates.

The piezoelectric oxide single crystal substrate of the present invention is characteristic in that it does not exhibit pyroelectric nature at its surface; but there are cases where it exhibits pyroelectric nature after going through polarization process. However, whether it exhibits pyroelectric nature or not, it is sufficiently useful as a substrate for surface acoustic wave device.

Also, the piezoelectric oxide single crystal substrate of the present invention is characteristic in that when a perpendicular vibration in the thickness direction is imparted to the principal face and the back face of the substrate, the voltage waveform thereby generated is zero, and when a vibration in the shearing direction is imparted to the principal face and the back face, the voltage waveform thereby generated shows piezoelectricity.

The crystal orientation of the piezoelectric oxide single crystal substrate of the present invention can be selected arbitrarily; however, from the viewpoint of properties it is preferable to select a 36°-49° rotation Y cut. Also, the thickness of the substrate of the present invention may be selected based on the requirements, while it is preferably 0.2 mm through 0.4 mm in view of the application as the substrate for surface acoustic wave device.

It is possible to manufacture the piezoelectric oxide single crystal substrate of the present invention by subjecting, for example, a singly polarized oxide single crystal substrate of roughly congruent composition to a gas phase treatment whereby Li diffusion is effected into the substrate from the surface thereof. As for the oxide single crystal substrate of roughly congruent composition, it can be produced by first obtaining a single crystal ingot using a known method such as Czochralski method, then cutting it and maybe lapping or polishing it depending on the requirements.

Also, the polarization process can be conducted in any known method; and as for the gas phase treatment, although in the examples it was conducted by burying a substrate in powder of which the principal ingredient was $Li_3TaO_4$, there is no limitations as to the kind and the state of the material to be used. As for the substrate to which gas phase treatment was applied, it is acceptable to further apply to it machining or other treatment depending on the requirements.

We will now explain the invention in a concrete manner using examples and comparative examples.

EXAMPLES

Example 1

In Example 1, at first, a singly polarized 4-inch diameter lithium tantalate single crystal ingot having a roughly congruent composition wherein the Li:Ta ratio was 48.5:51.5 was sliced into wafers, and some Z cut and 38.5° rotation Y cut lithium tantalate substrates having a thickness of 300 μm were obtained. Thereafter, depending on the requirements, the surface roughness of each sliced wafer was adjusted to 0.15 μm in terms of arithmetic mean roughness Ra through a lapping process, and the finishing thickness was rendered 250 μm. Next, some of the substrates were plane-polished on one side, which was rendered 0.01 μm in Ra measure to turn to be semi-mirror face, and these substrates were buried in a powder based on Li, Ta and O and having $Li_3TaO_4$ as the principal ingredient. The powder having $Li_3TaO_4$ as the principal ingredient used on this occasion was obtained by mixing powders of $Li_2CO_3$ and $Ta_2O_5$ at a molar ratio of 7:3, and then baking the mixture at 1300° C. for 12 hours. Then this powder having $Li_3TaO_4$ as the principal ingredient was laid in a small container and the sliced wafers were buried in the powder of $Li_3TaO_4$.

Next, this small container was set in an electric furnace, and the atmosphere inside the furnace was made to be of $N_2$, and the heating at 950° was conducted for 36 hours to thereby effect diffusion of Li through the surface into the middle portion of the wafer. Thereafter, the sliced substrate thus treated was subjected to an annealing treatment for 12 hours in the atmosphere at a temperature of 750° C., which is above the Curie temperature. The coarse side face of the substrate was finished to have about 0.15 μm in Ra with sand blast, and the semi-mirror face was polished by 3 μm. Although, this substrate was exposed to a temperature above the Curie temperature on this occasion, no singly polarizing treatment was conducted on this substrate.

With respect to one of the substrates thus manufactured, a measurement was made of the value of half-value width of Raman shift peak in the vicinity of 600 $cm^{-1}$, which is an indicator of Li diffusion amount, at a location 1 cm or more remote from the circumference of the substrate, shifting the measuring point in depth-wise direction from the surface, using a laser Raman spectrometric measurement apparatus (manufactured by HORIBA Scientific Ltd.; LabRam HR series, Ar ion laser, spot size 1 μm; room temperature); and the result of Raman profile as shown in FIG. 1 was obtained.

According to the result shown in FIG. 1, this substrate had different Raman half-value widths between its surface and its inside part, and in the range from about 5-μm depth through about 50-μm depth of the substrate, Raman half-value width value decreased as the measuring point approached the substrate surface, and Raman half-value width value increased as the measuring point approached the middle of the substrate.

Raman half-value width at the substrate surface was 6.1 $cm^{-1}$, and Raman half-value width at the thickness-wisely middle part of the substrate was 8.5 $cm^{-1}$. Now, it can be understood in this case that Li concentration started increasing at a depth of 53 μm or smaller so that the middle position of the substrate in the thickness direction was determined to lie at the depth of 53 μm. Therefore, the difference between the Raman half-value width value at the substrate surface and the Raman half-value width value at the thickness-wisely middle part of the substrate was 2.4 $cm^{-1}$.

From the above result, it was confirmed in Example 1 that there occurred a difference in Li concentration between the substrate surface and the inner part of the substrate and that the substrate has a range extending in the depth direction from about 5-μm depth through about 50 μm depth where a Li concentration profile is established such that the closer the measuring point is to the substrate surface, the higher the Li concentration is, and that the closer the measuring point is to the middle part of the substrate, the lower the Li concentration is.

Further, Raman half-value width between the substrate surface and 5-μm depth is about 6.1 cm$^{-1}$, so that from the following Equation (1) the composition in the said range is such that Li/(Li+Ta)=0.501; and thus it was found that a pseudo stoichiometric composition was established.

$$Li/(Li+Ta)=(53.15-0.5FWHM_1)/100 \quad (1)$$

Next, since Raman half-value width at the thickness-wisely middle part of the substrate was about 8.5-8.7 cm$^{-1}$, the same Equation (1) gives the value of Li/(Li+Ta) to be 0.488-0.489 and hence it was found a roughly congruent composition was established.

Also, the warpage of the 4-inch substrate to which the Le diffusion had been effected was measured by means of laser beam interference method, and the resultant value was as small as 50 μm, and no breakage or cracking were observed. Furthermore, these lithium tantalate single crystal substrates were heated in a hot plate, and when the surface potential was measured, the resulting voltage was 0 V, so that it was confirmed that the substrates of Example 1 would not show pyroelectricity in their surfaces even after they are subjected to a heat treatment.

Next, a small piece was cut out from a Z cut and 38.5° rotation Y cut, and, in a Piezo d33/d15 meter (model ZJ-3BN) manufactured by The Institute of Acoustics of the Chinese Academy of Sciences, the small piece was given a vertical vibration in the thickness direction to the principal face and also to the back face respectively to observe the voltage waveform thereby induced, and the voltage was observed to be 0 V and the piezoelectric constant d33 was observed zero too. Similarly, using d15 unit of the same apparatus, the small piece was given a vibration in the shearing direction to the principal face and also to the back face respectively to observe the voltage waveform thereby induced, a waveform representing piezoelectricity was obtained. The piece was hit with the end of the probe of a synchro scope for observation of piezoelectric response, and a waveform representing a piezoelectric response was observed. Therefore, having piezoelectricity, the substrate of Example 1 was confirmed to be usable for surface acoustic wave device.

Next, after removing from the surface of one face of each piece a thickness of 50 μm by means of hand lapping, each piece was hit with the end of the probe of a synchro scope for observation of piezoelectric response, and the piezoelectric response observed had a smaller voltage than in the above-described case. Then from the other face of each piece a thickness of 50 μm was removed by hand lapping, and each piece was hit with the end of the probe of a synchro scope for observation, and no piezoelectric response was observed.

Also, with respect to this piece, a vertical vibration in the thickness direction was given to its principal face and also to its back face respectively to observe the voltage waveform thereby induced, and the voltage was observed to be 0 V and the piezoelectric constant d33 was observed zero too. Similarly, using d15 unit of the same apparatus, the piece was given a vibration in the shearing direction to its principal face and also to its back face respectively, and it was observed that the voltage waveform thereby induced did not indicate piezoelectricity, and the voltage was 0 V.

Therefore, it was confirmed from this result that the substrates of Example 1 had their surface layer, which covers from the surface through the depth of 50 μm, modified to have pseudo stoichiometric composition, which exhibits piezoelectricity; whereas it was confirmed that that part of each substrate which is 50 μm or deeper does not exhibit piezoelectricity, and hence the thickness-wisely central vicinities are confirmed to be of multi-domain structure, where polarization directions are not oriented in one direction.

Next, the 4-inch 38.5° Y cut lithium tantalate single crystal substrate, which had received the Li diffusion treatment and the annealing treatment and had been polished, was subjected to a sputtering treatment whereby the surface of the substrate was covered with 0.05-μm-thick Al film. Thereafter, a resist was applied to the thus sputtered substrate; then in an aligner, the substrate was exposed and developed with a pattern of a SAW resonator and a ladder filter, and a patterning for evaluation of its SAW characteristic was given to the substrate by means of RIE. The length of one wave of the SAW electrode thus patterned was set to 4.8 μm.

Figure 2:
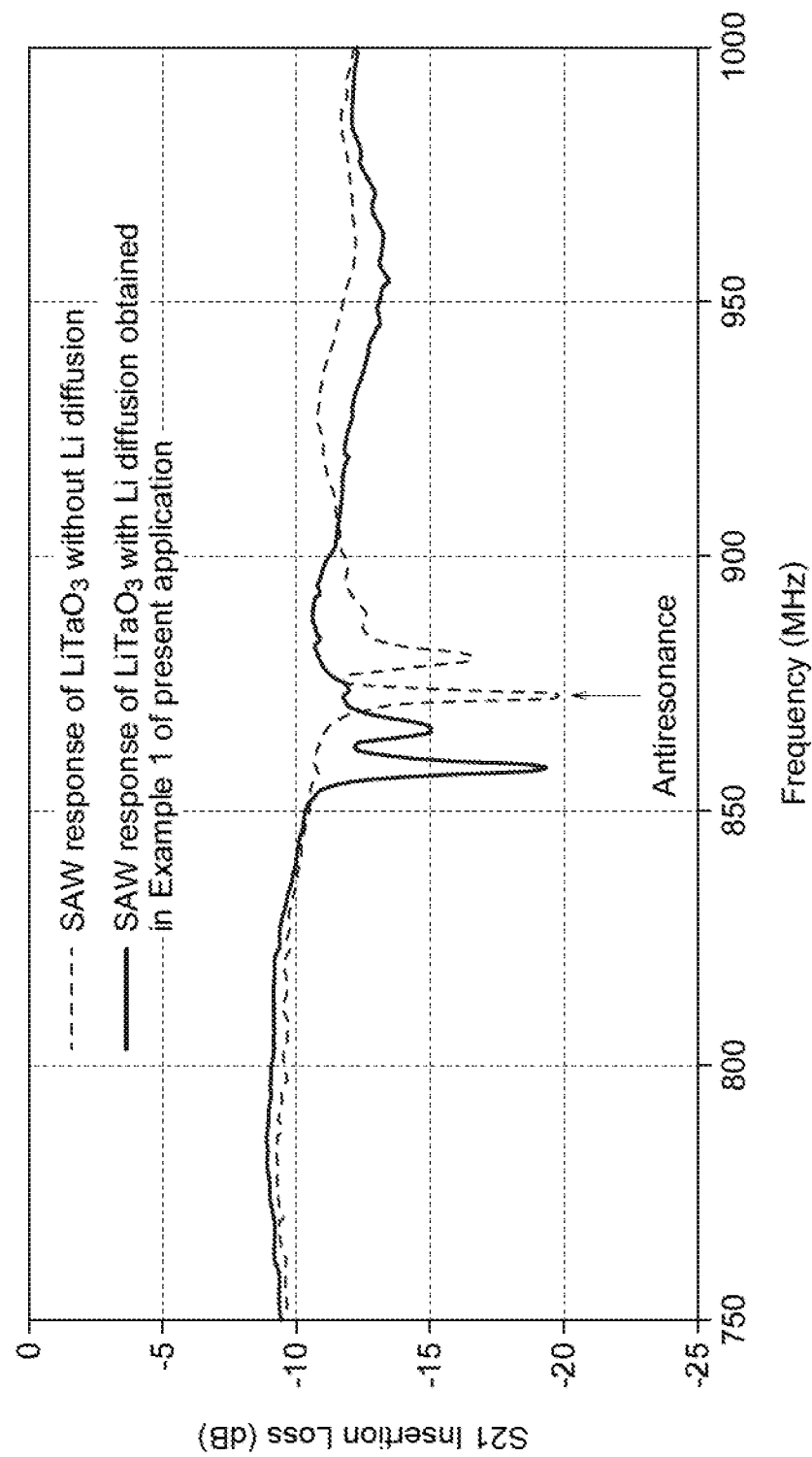
FIG. 2 shows insertion loss waveforms of the series resonant SAW resonator provided with input and output terminals and formed on the lithium tantalate single crystal substrate obtained in Example 1.
Figure 3:
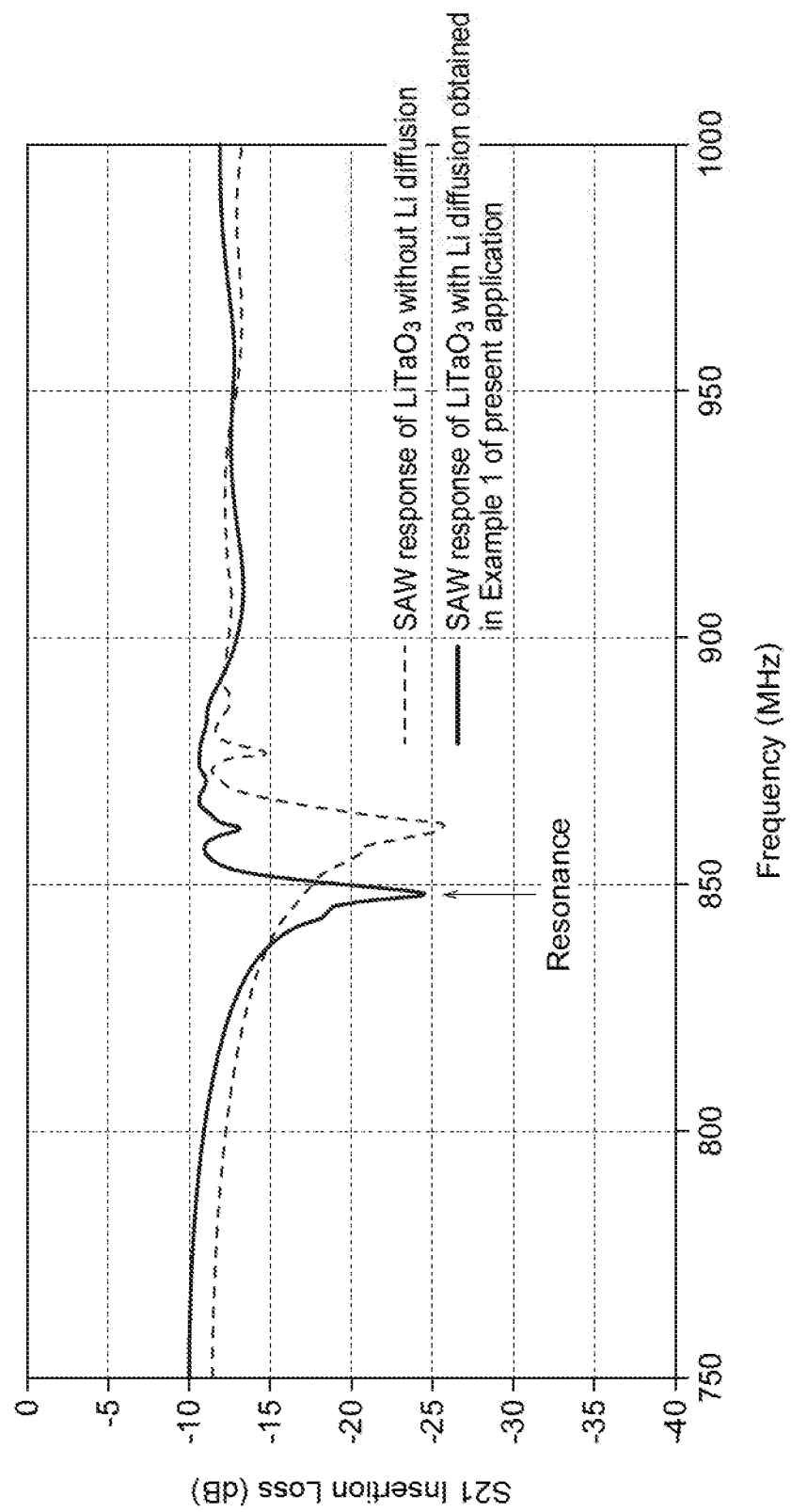
FIG. 3 shows insertion loss waveforms of parallel resonant SAW resonator provided with input and output terminals and formed on the lithium tantalate single crystal substrate obtained in Example 1.

Then, in this SAW resonator a series resonant type resonator and a parallel resonant type resonator, to each of which an input-output terminal was provided, were formed, and their SAW waveform characteristics were examined by means of an RF prober and the results obtained were as shown in FIG. 2 and FIG. 3. FIG. 2 and FIG. 3 respectively illustrate the SAW waveform characteristics observed on that occasion, and for the purpose of comparison, SAW waveform characteristic of the 38.5° Y cut lithium tantalate single crystal substrate to which no Li diffusion treatment was applied is illustrated alongside. Therefore, from these results, the substrate of Example 1 too was confirmed to exhibit a SAW waveform characteristic desirable for its use with a surface acoustic wave device.

Figure 4:
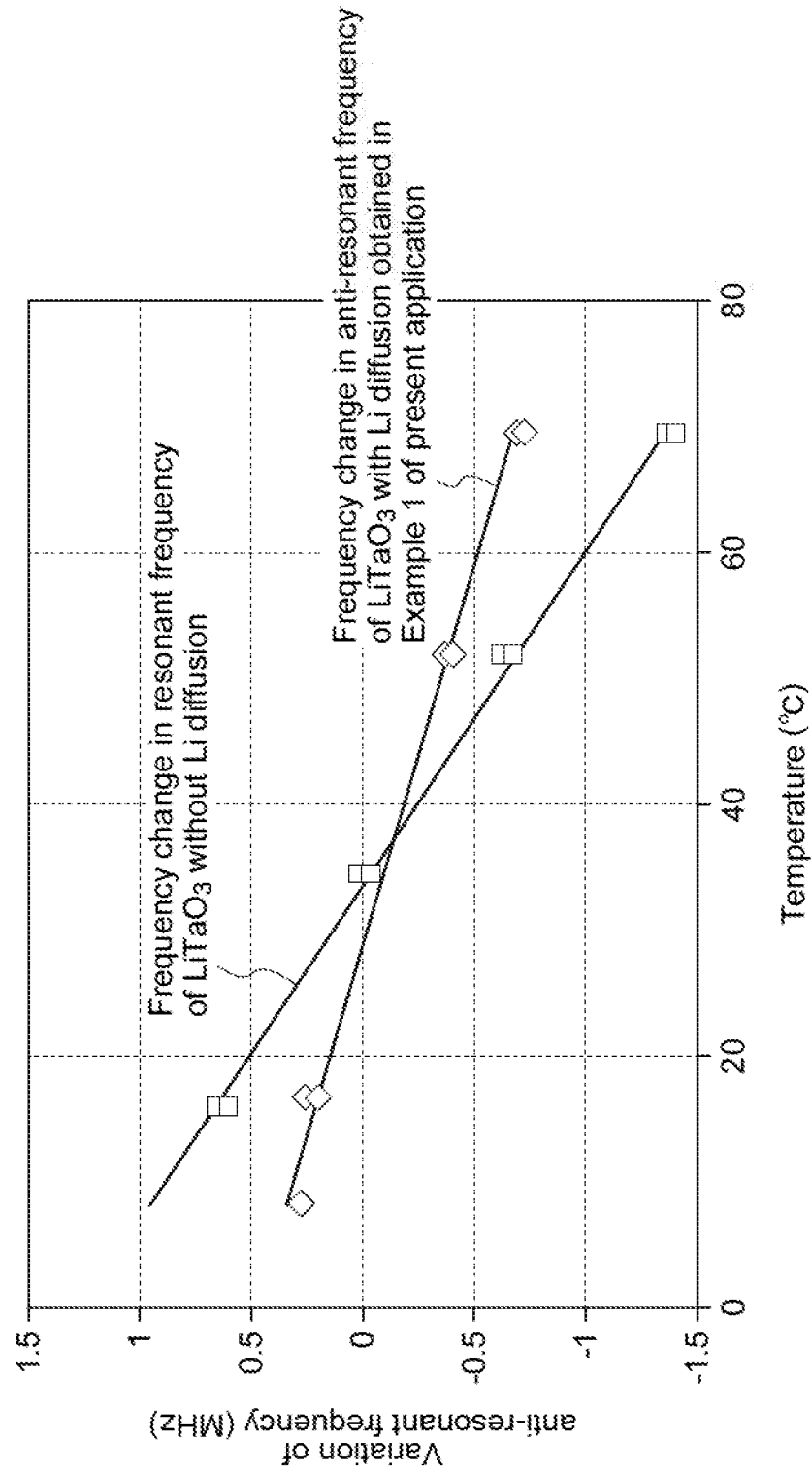
FIG. 4 shows temperature dependence of the anti-resonance frequency of the SAW resonator formed on the lithium tantalate single crystal substrate obtained in Example 1.
Figure 5:
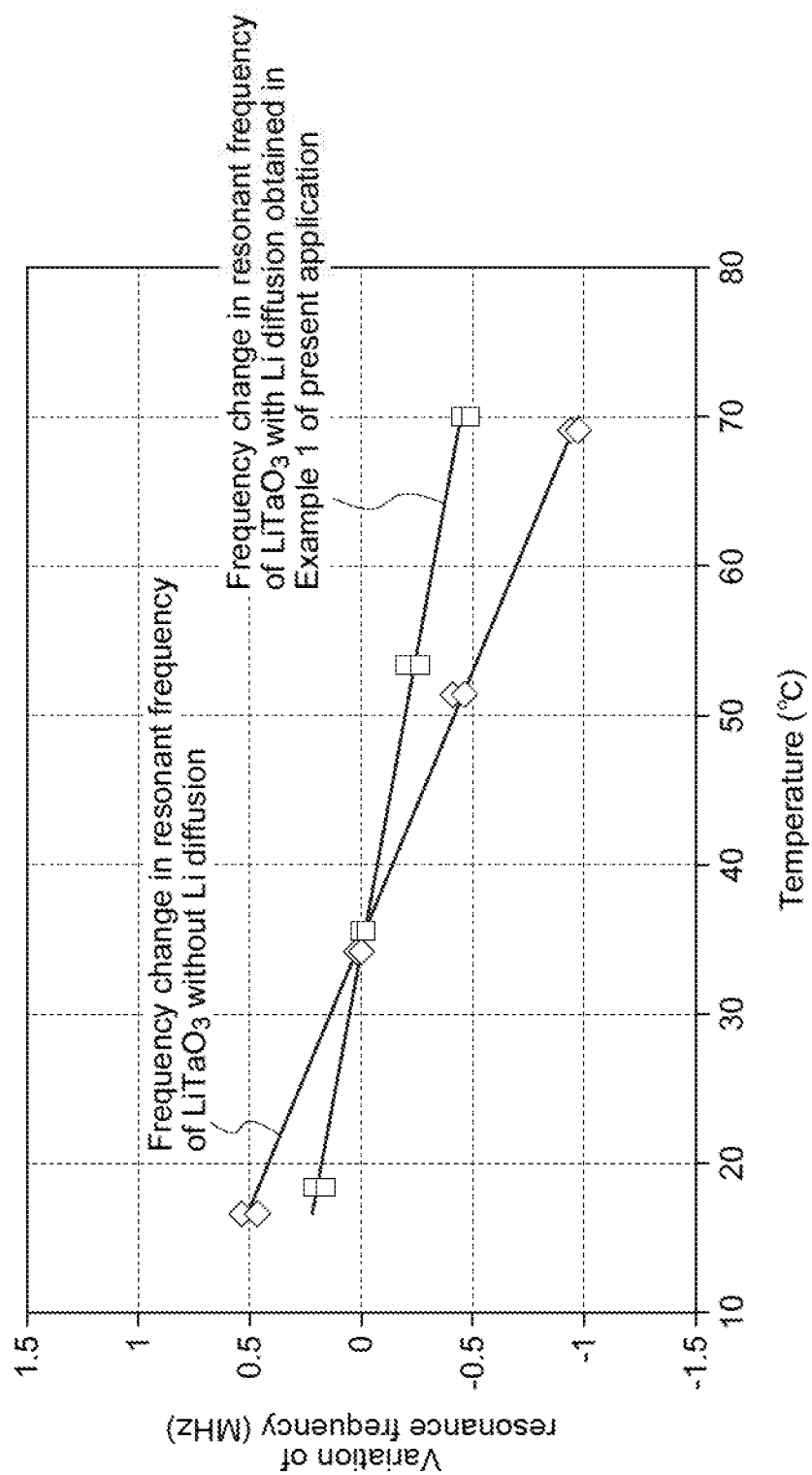
FIG. 5 shows temperature dependence of the resonance frequency of the SAW resonator formed on the lithium tantalate single crystal substrate obtained in Example 1.

Then, varying a stage temperature from about 16° C. through 70° C., the temperature coefficient of the antiresonance frequency and that of the resonance frequency were examined, and the results obtained are shown in FIG. 4 and FIG. 5. From the results obtained in Example 1, FIG. 4 shows the temperature coefficient of antiresonance frequency was −19 ppm/° C., and FIG. 5 shows the temperature coefficient of resonance frequency was −15 ppm/° C., so that the average frequency temperature coefficient was −17 ppm/° C. Also, for the purpose of comparison, it was obtained that, in the case of the 38.5° Y cut lithium tantalate single crystal substrate to which no Li diffusion treatment was applied, the temperature coefficient of this substrate was such that the temperature coefficient of antiresonance frequency was −42 ppm/° C., and the temperature coefficient of resonance frequency was −32 ppm/° C., so that the average frequency temperature coefficient was −37 ppm/° C.

Therefore, the substrate of Example 1 had a smaller average frequency temperature coefficient than the substrate which had not received Li diffusion treatment, and it underwent smaller property changes with temperature, so that it was confirmed that it has a good temperature characteristic.

Example 2

In Example 2, similarly as in Example 1, a singly polarized 4-inch diameter lithium tantalate single crystal ingot having a roughly congruent composition wherein the Li:Ta ratio was 48.5:51.5 was sliced, and Z cut and 42° rotation Y cut lithium tantalate substrates having a thickness of 300 μm were obtained. Thereafter, the surface roughness of each sliced wafer was adjusted to 0.15 μm in terms of Ra measure through a lapping process; and under the same conditions as in Example 1, Li diffusion treatment was worked on them.

Next, in this Example 2, under annealing treatment conditions differing form those in Example 1, that is, each sliced wafer was subjected to an annealing treatment in $N_2$ at 1000° C., which is higher than Curie temperature, for 12 hours. Thereafter, the wafers received the same finishing and polishing machining as in Example 1, and a number of lithium tantalate single crystal substrate was obtained. In this case, each of these substrates was exposed to a temperature higher than Curie temperature, but no singly polarizing treatment was worked on each substrate.

Figure 6:
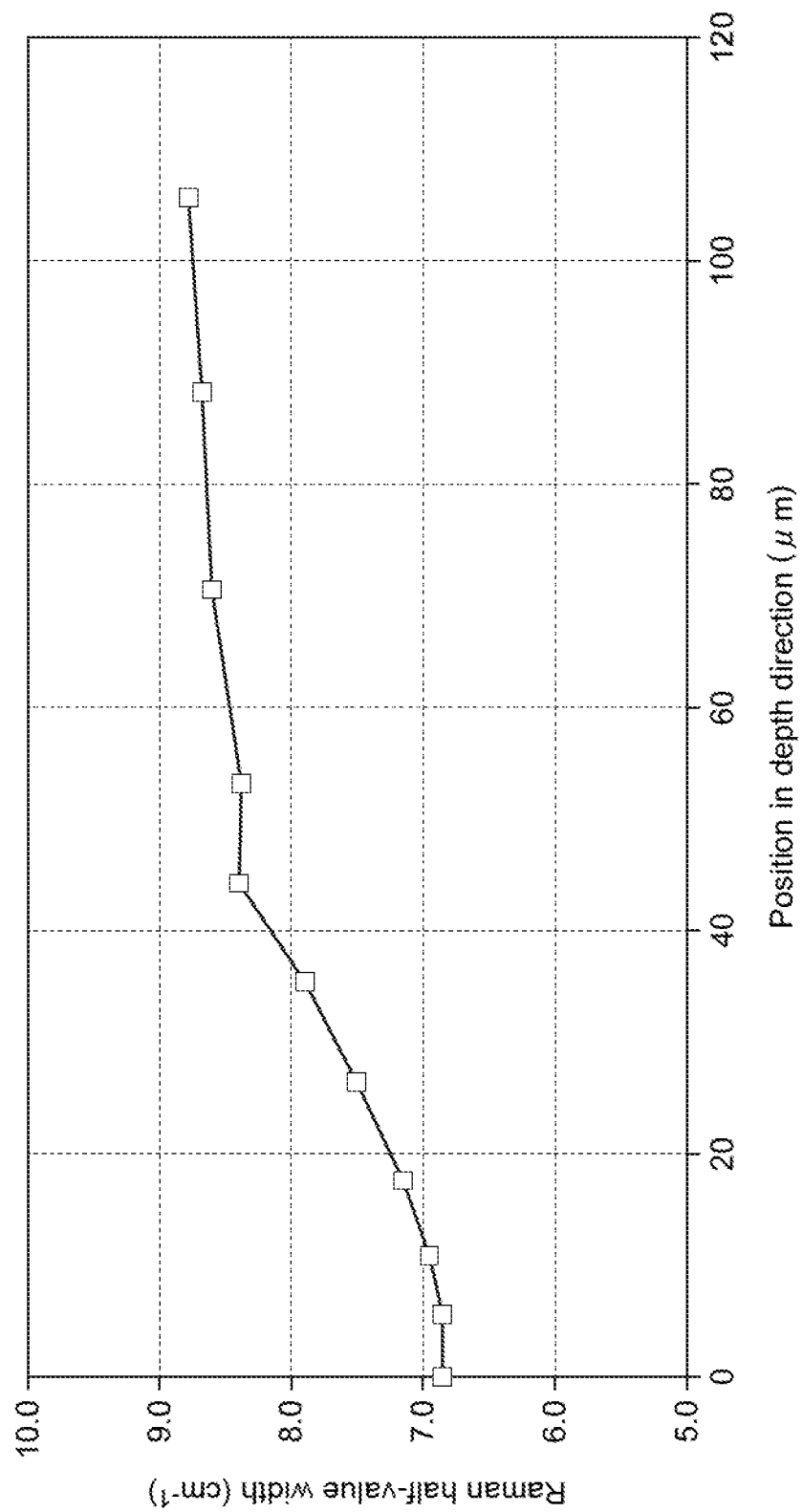
FIG. 6 shows a Raman profile of lithium tantalate single crystal substrate obtained in Example 2.

One of these substrates thus manufactured was measured for the half-value width of the Raman shift peak in the vicinity of 600 cm-1 which is an indicator of Li diffusion amount, the measurement being effected in the depth direction from the surface; as the result the Raman profile shown in FIG. 6 was obtained.

From the result shown in FIG. 6, this substrate has different Raman half-value width between its substrate surface and the interior of the substrate, and it is seen that the substrate has a range extending from the surface to a position of about 50 μm in the substrate's depth direction in which the closer the measuring point is to the substrate surface, the smaller the Raman half-value width value becomes, and the closer the measuring point is to the middle of the substrate, the greater the Raman half-value width becomes.

Also, the Raman half-value width at the substrate surface was 6.9 $cm^{-1}$, and the Raman half-value width at the substrate's thickness-wisely middle part was 8.4 $cm^{-1}$. Now, in this case, Li concentration was thought to start increasing at the location of 53 μm or less in the depth direction, so that it was regarded that the substrate's thickness-wisely middle part is the position of 53 μm in the thickness direction. Therefore, the difference between the Raman half-value width value at the substrate surface and the Raman half-value width value at the substrate's thickness-wisely middle part was 1.5 $cm^{-1}$.

From the above results, in Example 2, Li concentration differs between the substrate surface and the substrate interior, and the substrate was confirmed to have a range from the substrate surface to the position of about 50-μm depth in the thickness direction wherein the Li concentration profile is such that the closer to the substrate surface the measuring point is, the higher is the Li concentration, and the closer to the middle part of the substrate the measuring point is, the smaller is the Li concentration.

Also, the Raman half-value width at the substrate surface was about 6.9 $cm^{-1}$, so that using Equation (1) above, as done in Example 1, the composition at the substrate surface becomes roughly Li/(Li+Ta)=0.497, and thus a pseudo stoichiometric composition was established. Furthermore, the Raman half-value width at the substrate's thickness-wisely middle part was about 8.4-8.8 $cm^{-1}$, so that using the above Equation (1) in the same manner, the value of Li/(Li+Ta) becomes 0.488-0.490, so that it was found that a roughly congruent composition was established.

Further, the 4-inch substrate to which Li diffusion had been applied was evaluated with reference to warpage by means of laser beam interference method and the result of a small value of 50 μm, and breakage nor crack were observed. Furthermore, these lithium tantalate single crystal substrates were heated on a hot plate, and when the surface potential was measured, the resulting voltage was 0 V, so that it was confirmed that the substrates would not show pyroelectricity in their surfaces even after they are subjected to a heat treatment.

Next, in Example 2, a small piece was cut each from the Z cut and 42° Y cut, and in the similar manner as in Example 1, each small piece was given a vertical vibration in the thickness direction to their principal face and also to their back face respectively to observe the voltage waveform thereby induced, and the voltage observed was 0 V and the piezoelectric constant d33 was zero too. Similarly, a vibration in the shearing direction was given to the principal face and also to the back face respectively to observe the voltage waveform thereby induced, and a waveform representing piezoelectricity was obtained. This piece was hit with the end of the probe of a synchro scope for observation and a waveform representing a piezoelectric response was observed. Therefore, from this result, having piezoelectricity, the substrates of Example 2 were confirmed to be usable for surface acoustic wave device.

Next, similarly as in Example 1, after removing from the surface of one face of each piece a thickness of 50 μm by means of hand lapping, each piece was hit with the end of the probe of a synchro scope for observation of piezoelectric response, and the piezoelectric response observed had a smaller voltage than in the above-described case. Then from the other face of each piece a thickness of 50 μm was removed by hand lapping, and each piece was hit with the end of the probe of a synchro scope for observation, and no piezoelectric response was observed. Also, similarly as in Example 1, a vertical vibration in the thickness direction was given to its principal face and also to its back face respectively to observe the voltage waveform thereby induced, and the voltage was observed to be 0 V and the piezoelectric constant d33 was also zero; when a vibration in the shearing direction was given to the principal face and to the back face respectively, the voltage waveform thereby induced did not indicate piezoelectricity, and the voltage was 0 V.

Form the above described results, if was confirmed that the substrates of Example 2 too had their surface layer, which covers from the surface through the depth of 50 μm, modified to have pseudo stoichiometric composition, which exhibits piezoelectricity, and that that part of each substrate which is 50 μm or deeper from the surface does not exhibit piezoelectricity, and hence the thickness-wisely middle part was confirmed to be of multi-domain structure, where polarization directions are not oriented in one direction.

Figure 7:
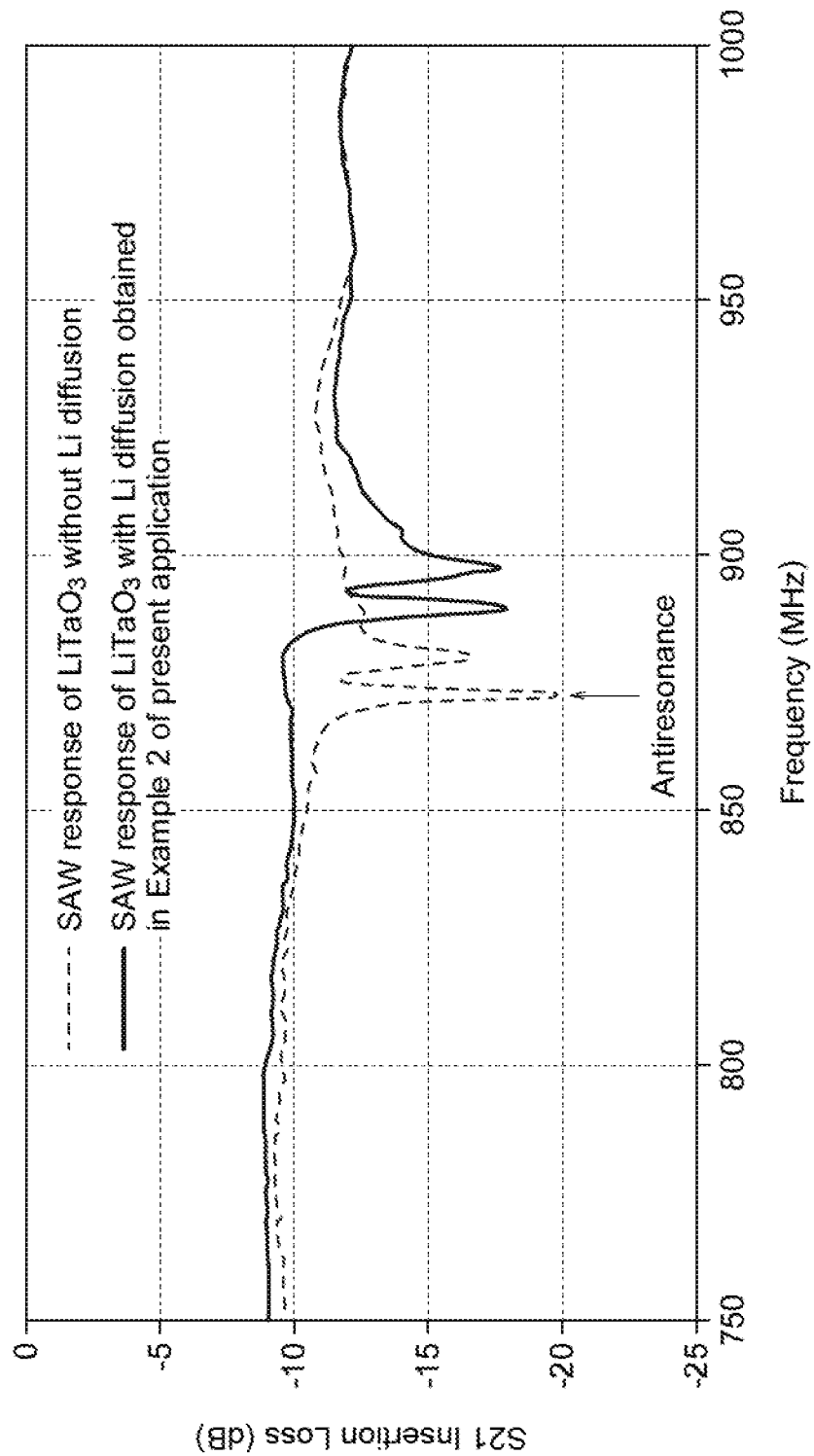
FIG. 7 shows insertion loss waveforms of the series resonant SAW resonator provided with input and output terminals and formed on the lithium tantalate single crystal substrate obtained in Example 2.
Figure 8:
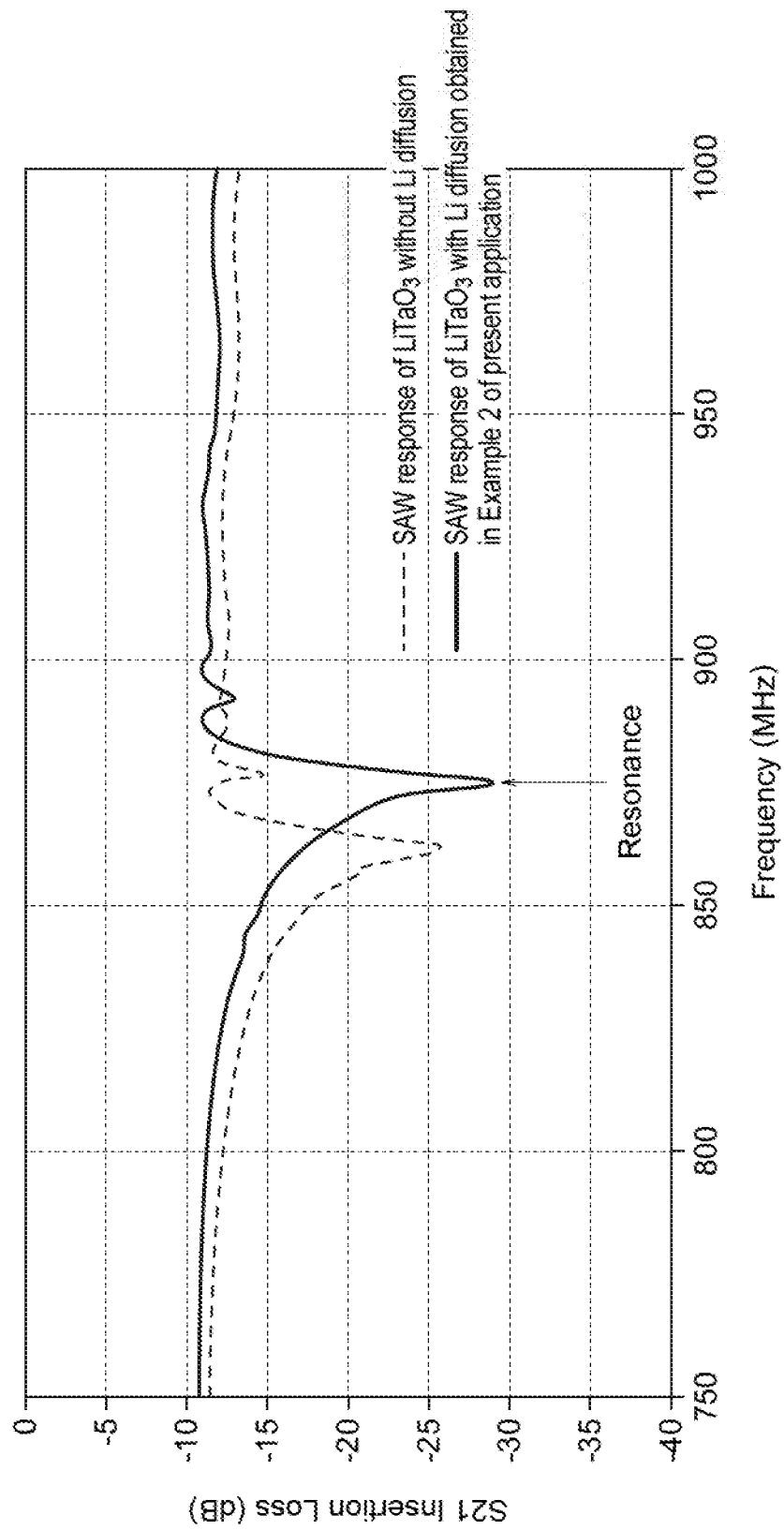
FIG. 8 shows insertion loss waveforms of the parallel resonant SAW resonator provided with input and output terminals and formed on the lithium tantalate single crystal substrate obtained in Example 2.

Next, also in Example 2, a 4-inch 42° Y cut lithium tantalate single crystal substrate, which had received Li diffusion treatment, annealing treatment and also polishing treatment, had its surface treated with the same treatment as in Example 1, and then its SAW property was evaluated, and the results obtained are as shown in FIG. 7 and FIG. 8. FIG. 7 and FIG. 8 indicate the SAW waveform property at that time; and for the purpose of comparison, the SAW waveform property of the 42° Y cut lithium tantalate single crystal substrate is also illustrated. Hence, from this result, it was confirmed that the substrate of Example 2 too exhibits good SAW waveform property as div1

Figure 9:
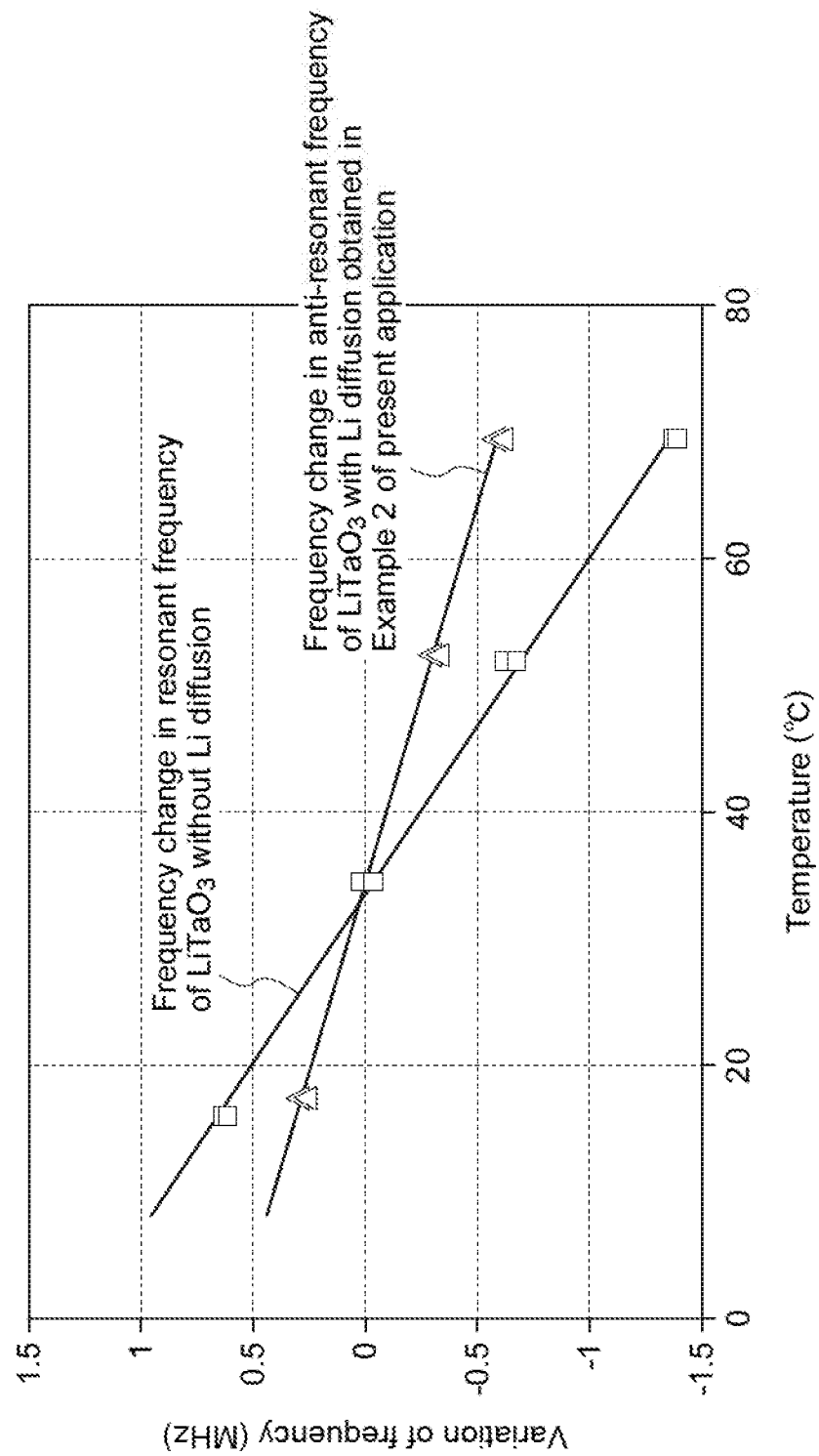
FIG. 9 shows temperature dependence of the anti-resonance frequency of the SAW resonator formed on the lithium tantalate single crystal substrate obtained in Example 2.
Figure 10:
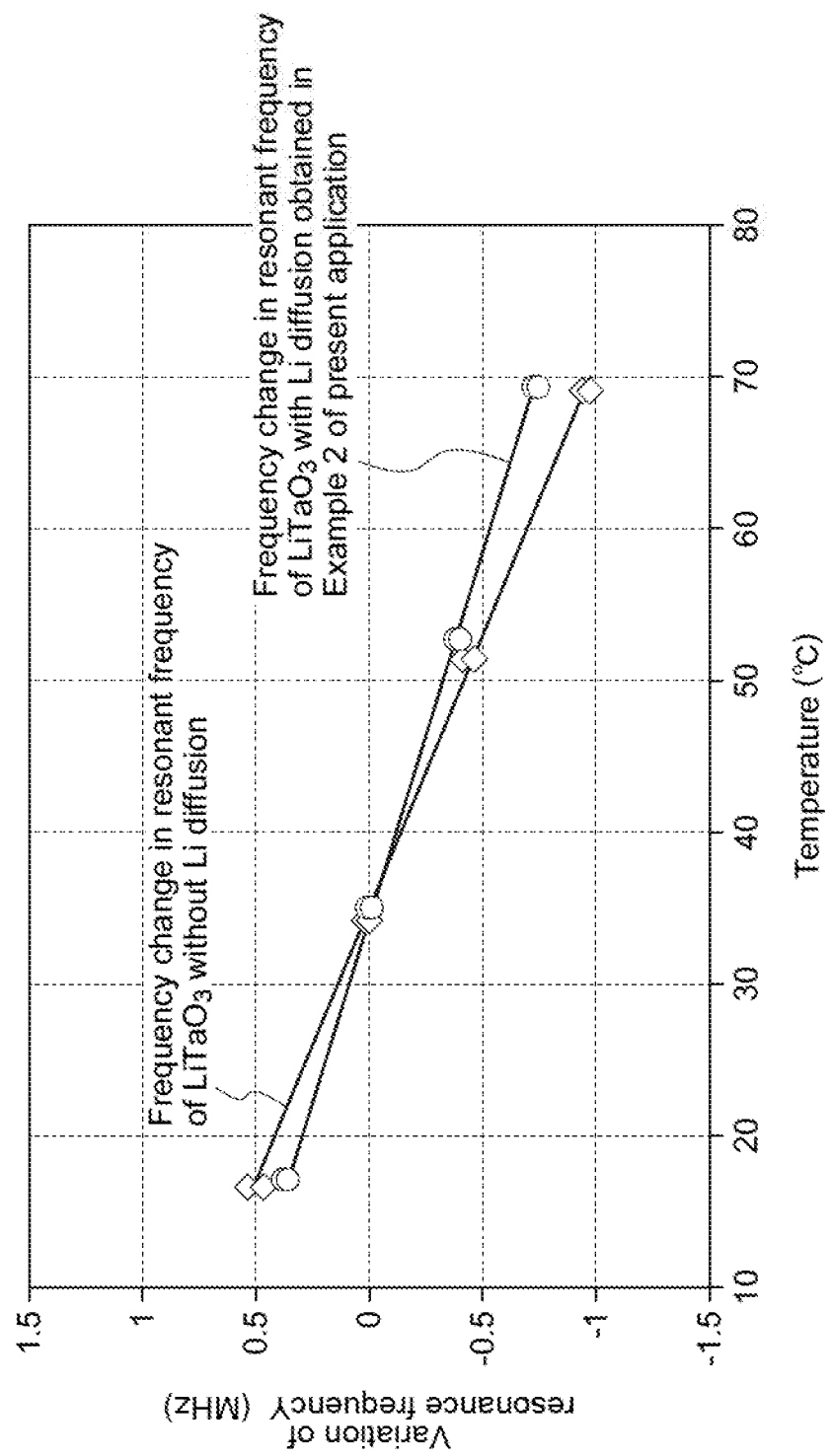
FIG. 10 shows temperature dependence of the resonance frequency of the SAW resonator formed on the lithium tantalate single crystal substrate obtained in Example 2.

Then, in the similar manner as in Example 1, the temperature coefficient of the antiresonance frequency and that of the resonance frequency were examined, and the results obtained are shown in FIG. 9 and FIG. 10. From the results, FIG. 9 shows that, in Example 2, the temperature coefficient of antiresonance frequency was −19 ppm/° C., and FIG. 10 shows the temperature coefficient of resonance frequency was −21 ppm/° C., so that the average temperature coefficient was −20 ppm/° C. Also, for the purpose of comparison, it was obtained that, in the case of the 42° Y cut lithium tantalate single crystal substrate to which no Li diffusion treatment was applied, the temperature coefficient of this substrate was such that the temperature coefficient of antiresonance frequency was −42 ppm/° C., and the temperature coefficient of resonance frequency was −32 ppm/° C. (FIG. 10), so that the average frequency temperature coefficient was −37 ppm/° C.

Therefore, the substrate of Example 2 too had a smaller average frequency temperature coefficient than the substrate which had not received Li diffusion treatment, and it underwent smaller property changes with temperature, so that it was confirmed that it has a good temperature characteristic.

Example 3

In Example 3, similarly as in Example 1, the Z cut and 38.5° rotation Y cut 300-μm-thick lithium tantalate substrates having a roughly congruent composition were used; they received the same lapping process and surface polishing treatments as in Example 1, and were subjected to the Li diffusion treatment, the annealing treatment and the final polishing treatment under the same conditions as in Example 1, whereby a number of lithium tantalate single crystal substrates for use with surface acoustic wave device were obtained.

Next, in Example 3, a number of substrates were piled up and they received single polarization treatment at 750° C., which is higher than the Curie temperature, while an electric field was being applied in roughly the +Z direction, unlike Examples 1 and 2. The warpage of the 4-inch substrate to the single polarization treatment had been effected was measured by means of laser beam interference method, and the resultant value was as small as 50 μm, and no breakage or cracking were observed. These substrates were heated in a hot plate, and when the surface potential was measured, the voltage was 2 kV.

From the above result, the substrate of Example 3, similarly as in the case of Example 1, had only small warpage and no breakage or cracking were observed in the surface, and it was confirmed that when a heat treatment is applied to this it would exhibit a strong pyroelectricity. This strong pyroelectricity was generated due to the single polarization treatment applied, and although its temperature characteristic was somewhat inferior to the substrates of Example 1 and Example 2, it was confirmed to be superior to that of common LT.

Also a small piece each was cut out from the Z cut and 38.5° Y cut, and their piezoelectric waveforms were observed, and, as in the case of Example 1, the result showed that they indicated piezoelectricity so that they were confirmed to be usable for surface acoustic wave device.

Further, the 4-inch 38.5° Y cut lithium tantalate single crystal substrate, which had received the Li diffusion treatment, the annealing treatment and polishing, had its surface subjected to the same treatments as in Example 1; then their temperature coefficients of antiresonance frequency and resonance frequency were evaluated and it was found that the temperature coefficient of antiresonance frequency was −32 ppm/° C. and the temperature coefficient of resonance frequency was −29 ppm/° C., so that the average frequency temperature coefficient was −31 ppm/° C.

Therefore, the substrates of Example 3 were confirmed to have a relatively good temperature characteristic, for compared with the comparative substrates (to which no Li diffusion treatment was applied), which were represented in FIG. 4 and FIG. 5 for the purpose of comparison, the substrates of Example 3 had somewhat smaller average frequency temperature coefficient and therefore would show smaller property changes with temperature.

Example 4

Nest, we will explain about Example 4, and this Example 4 distinguishes itself from Example 1 by that in place of conducting the Li diffusion treatment at 950° C. for 36 hours, the inventors conducted the same at 950° C. but for 5 hours so that in this example the treatment time was drastically decreased.

In Example 4, similarly as in Example 1, a singly polarized 4-inch diameter lithium tantalate single crystal ingot having a roughly congruent composition wherein the Li:Ta ratio was 48.5:51.5 was sliced, and the Z cut 38.5° rotation Y cut lithium tantalate substrates having a thickness of 300 μm were obtained. Thereafter, the substrates received the same polishing treatment as in Example 1 so that they had a semi-mirror face, and these substrates were buried in a powder, of which $Li_3TaO_4$ was the principal ingredient, contained in a small container, and were subjected to Li diffusion treatment in $N_2$ atmosphere at 950° C. for 5 hours.

Next, after this, these substrate were not given an annealing treatment, but were put through finishing and polishing treatments, and thus a number of lithium tantalate single crystal substrates were obtained. On this occasion, the substrates did not receive single polarization treatment.

With respect to one of the substrates thus manufactured, a measurement was made of the value of half-value width of Raman shift peak in the vicinity of 600 $cm^{-1}$, which is an indicator of Li diffusion amount, shifting the measuring point in depth-wise direction from the surface of the substrate, and it was found that this substrate had different Raman half-value widths between its surface and its inner part, and that the substrate had a region between the substrate surface and a position which was about 5 μm in the depth-wise direction of the substrate wherein the closer the measuring point is to the substrate surface, the smaller does the Raman half-value width turn, and the closer the measuring point is to the central part of the substrate, the greater does the Raman half-value width value turn.

Also, the Raman half-value width at the substrate surface was 6.5 $cm^{-1}$, and the Raman half-value width at the substrate's thickness-wisely middle part was 9.0 $cm^{-1}$. Now, it can be understood that Li concentration started increasing at a depth of 10 μm or smaller so that the middle position of the substrate in the thickness direction was determined to lie at the depth of 5 μm. Therefore, the difference between the Raman half-value width value at the substrate surface and Raman half-value width value at the thickness-wisely middle part of the substrate was 2.5 $cm^{-1}$.

From the above result, in Example 4, it was confirmed that there occurred a difference in Li concentration between the substrate surface and the inner part of the substrate and that the substrate had a Li concentration profile in the range from the substrate surface to about 5-μm depth in the depth direction wherein the closer the measuring point is to the substrate surface, the higher is the Li concentration, and the closer the measuring point is to the middle part of the substrate, the lower is the Li concentration.

Further, Raman half-value width at the surface was about 6.5 $cm^{-1}$, so that using the same Equation (1) as in Example 1, it was found that the composition at the substrate surface was Li/(Li+Ta)=0.499, and thus it was found that a pseudo stoichiometric composition was established. The Raman half-value width at the substrate's thickness-wisely middle part was about 9.0-9.3, so that, using the above-mentioned Equation (1), the value of Li/(Li+Ta) becomes 0.485-0.487, and thus it was found that a roughly congruent composition was established.

Furthermore, the warpage of the 4-inch substrate to which the Le diffusion had been effected was measured by means of laser beam interference method, and the resultant value was as small as 50 μm, and no breakage or cracking were observed. Then, these lithium tantalate single crystal substrates were heated in a hot plate, and when the surface potential was measured, the resulting voltage was 0 V, so that it was confirmed that these substrates would not show pyroelectricity in their surfaces even after they are subjected to a heat treatment.

Next, a small piece was cut out each from the Z cut and 38.5° rotation Y cut, and, in a Piezo d33/d15 meter (model ZJ-3BN) manufactured by The Institute of Acoustics of the Chinese Academy of Sciences, each small piece was given a vertical vibration in the thickness direction to their principal face and also to their back face respectively to observe the voltage waveform thereby induced, and the voltage was observed to be 0 V and the piezoelectric constant d33 was observed zero too. Similarly, using d15 unit of the same apparatus, each small piece was given a vibration in the shearing direction to their principal face and also to their back face respectively to observe the voltage waveform thereby induced, and a waveform representing piezoelectricity was obtained. These pieces were hit with the end of the probe of a synchro scope for observation of piezoelectric response, and a waveform representing a weak piezoelectric response was observed. Therefore, having piezoelectricity, the substrates of Example 4 were confirmed to be usable for surface acoustic wave device.

Next, after removing from the surface of one face of each piece a thickness of 5 μm by means of hand lapping, each piece was hit with the end of the probe of a synchro scope for observation of piezoelectric response, and the piezoelectric response observed had a smaller voltage than in the above-described case. Then from the other face of each piece a thickness of 5 μm was removed by hand lapping, and each piece was hit with the end of the probe of a synchro scope for observation, and no piezoelectric response was observed.

Also, with respect to this piece, a vertical vibration in the thickness direction was given to its principal face and also to its back face respectively to observe the voltage waveform thereby induced, and the voltage was observed to be 0 V and the piezoelectric constant d33 was observed as zero too. Similarly, using d15 unit of the same apparatus, the piece was given a vibration in the shearing direction to its principal face and also to its back face respectively, and it was observed that the voltage waveform thereby induced did not indicate piezoelectricity, and the voltage was 0 V. Therefore, it was confirmed from this result that the substrates of Example 4 had piezoelectricity up to the depth of 5 μm, but that beyond that depth of 5 μm they were not denatured and thus that part is of multi-domain structure and does not exhibit piezoelectricity.

Next, the substrate was subjected to a sputtering treatment whereby the surface of the substrate was covered with a 0.05-μm-thick Al film; thereafter, a resist was applied to the substrate; then in an aligner, the substrate was exposed and developed with a pattern of a SAW resonator and a ladder filter, and a patterning for evaluation of its SAW characteristic was given to the substrate by means of RIE. The length of one wave of the SAW electrode thus patterned was set to 4.8 μm. Then, in this SAW resonator a series resonant type resonator and a parallel resonant type resonator, to each of which an input-output terminal was provided, were formed, and their SAW waveform characteristics were examined by means of an RF prober, and it was found that the responsive wave shape of this SAW had a slight collapse.

Therefore, from this result, it was confirmed that, as was the case with Example 4, if the Li diffusion treatment is as short as 5 hours, denaturing of the substrate by Li diffusion does not progress sufficiently so that the position in the Li concentration profile at which the Li concentration starts increasing comes on the shallower side of the position of 5 μm from the substrate surface in the thickness direction, whereupon the responsive wave shape of the SAW starts collapsing.

Example 5

In Example 5, similarly as in the case of Example 1, a singly polarized 4-inch diameter lithium tantalate single crystal ingot having a roughly congruent composition wherein the Li:Ta ratio was 48.5:51.5 was sliced, and thus the Z cut and 38.5° rotation Y cut lithium tantalate substrates having a thickness of 300 μm were obtained. Thereafter, the surface roughness of each sliced wafer was adjusted to 0.15 μm in terms of Ra measure through a lapping process; and they were subjected to Li diffusion treatment in $N_2$ at 950° C. for 60 hours, unlike the conditions of Example 1, whereby the roughly congruent composition was changed to a pseudo stoichiometric composition.

Next, in Example 5, the sliced wafers were subjected to an annealing treatment in $N_2$ at 800° C., which is higher than the Curie temperature, for 10 hours, unlike the annealing conditions of Example 1. Thereafter, the same finishing and polishing treatments as in Example 1 were applied and a number of lithium tantalate single crystal substrates were obtained. In this case, although these substrates were exposed to a temperature higher than the Curie temperature, no single polarization treatment was applied to these substrates.

With respect to one of the substrates thus manufactured, a measurement was made of the value of half-value width of Raman shift peak in the vicinity of 600 $cm^{-1}$, which is an indicator of Li diffusion amount, and it was found that this substrate had different Raman half-value widths between its surface and its inside part, and in the range from about 20-μm depth through about 70-μm depth of the substrate, Raman half-value width value decreased as the measuring point approached the substrate surface, and Raman half-value width value increased as the measuring point approached the middle of the substrate.

The Raman half-value width at the substrate surface was 6.2 $cm^{-1}$, and the Raman half-value width at the thickness-wisely middle part of the substrate was 8.4 $cm^{-1}$. Now, it can be understood in this case that Li concentration started increasing at a depth of 75 μm or smaller so that the middle position of the substrate in the thickness direction was determined to lie at the depth of 75 μm. Therefore, the difference between the Raman half-value width value at the substrate surface and Raman half-value width value at the thickness-wisely middle part of the substrate was 2.2 $cm^{-1}$.

From the above result, in Example 5, it was confirmed that there occurred a difference in Li concentration between the substrate surface and the inner part of the substrate and that the substrate had a range extending in its depth direction from about 20-μm depth through about 70-μm depth where a Li concentration profile was established such that the closer to the substrate surface the measuring point is, the higher is the Li concentration, and the closer to the middle part of the substrate the measuring point is, the lower is the Li concentration.

Also, the Raman half-value width in the range from the substrate surface to the depth of 20 μm was about 6.1-6.3 $cm^{-1}$, so that using Equation (1) above, as done in Example 1, the composition in that range becomes such that Li/(Li+Ta)=0.500, and thus it was found that a pseudo stoichiometric composition was established. Furthermore, the Raman half-value width at the substrate's thickness-wisely middle part was about 8.4-8.6 cm$^{-1}$, so that using the above Equation (1) in the same manner, the value of Li/(Li+Ta) becomes 0.489-0.490, so that it was found that a roughly congruent composition was established.

Also, the warpage of the 4-inch substrate to which the Li diffusion had been effected was measured by means of laser beam interference method, and the resultant value was 80 μm, which is slightly greater than the results of Examples 1 through 4. No breakage or cracking were observed. These lithium tantalate single crystal substrates were heated in a hot plate, and when their surface potential was measured, the resulting voltage was 0 V, so that it could be confirmed that the substrates would not show pyroelectricity in their surfaces even after they are subjected to a heat treatment.

Next, a small piece was cut out each from the Z cut and 38.5° Y cut, and, in the same manner as in Example 1, each small piece was given a vertical vibration in the thickness direction to their principal face and also to their back face respectively to observe the voltage waveform thereby induced, and the voltage was 0 V and the piezoelectric constant d33 was zero too. Similarly, when a vibration in the shearing direction was given to their principal face and also to their back face respectively to observe the voltage waveform thereby induced, a waveform representing piezoelectricity was obtained. These pieces were hit with the end of the probe of a synchro scope for observation of piezoelectric response, and a waveform representing it was observed. Therefore, from the this result, the substrates of Example 5, having piezoelectricity, were also confirmed to be usable for surface acoustic wave device.

Next, after removing from the surface of one face of each piece a thickness of 70 μm by means of hand lapping, each piece was hit with the end of the probe of a synchro scope for observation of piezoelectric response, and the piezoelectric response observed had a smaller voltage than in the above-described case. Then from the other face of each piece a thickness of 50 μm was removed also by hand lapping, and each piece was hit with the end of the probe of a synchro scope for observation, and no piezoelectric response was observed.

Also, a vertical vibration in the thickness direction was given to the principal face and the back face of each piece respectively to observe the voltage waveform thereby induced, and the voltage observed was 0 V and the piezoelectric constant d33 was zero too; then, each piece was given a vibration in the shearing direction to its principal face and also to its back face respectively, and it was observed that the voltage waveform thereby induced did not indicate piezoelectricity, and the voltage was 0 V.

Therefore, it was found from this result that the substrates of Example 5 had their surface layer, which covers from the surface through the depth of 70 μm, modified to have pseudo stoichiometric composition, which exhibits piezoelectricity; whereas it was also found that that part of each substrate which is 70 μm or deeper does not exhibit piezoelectricity, and hence the thickness-wisely central vicinities were confirmed to be of multi-domain structure, where polarization directions are not oriented in one direction.

Next, also in Example 5, the 4-inch 38.5° Y cut lithium tantalate single crystal substrate, which had received the Li diffusion treatment and the annealing treatment and had been polished, received the same surface treatments as in Example 1, and was examined for its SAW characteristics, and it was found the substrate of Example 5 also exhibits SAW waveform characteristics desirable for its use with a surface acoustic wave device.

Then, in the similar manner as in Example 1, the temperature coefficient of the antiresonance frequency and that of the resonance frequency were examined, and the result shows that, in Example 5, the temperature coefficient of antiresonance frequency was −18 ppm/° C., and the temperature coefficient of resonance frequency was −15 ppm/° C., so that the average temperature coefficient was −17 ppm/° C.

Therefore, the substrate of Example 5 had a smaller average frequency temperature coefficient compared with the substrate which had not received the Li diffusion treatment, and since its property variation with temperature is small it was confirmed that its temperature characteristic is good.

Furthermore, as the results of Example 5 and Example 1 are compared with each other, it is seen that although the frequency temperature coefficients are on a same level, the warpage of the substrate of Example 5 is greater. This is thought to be due to the fact that, compared with Example 1, the Li diffusion treatment and the annealing treatment were conducted at higher temperatures and for longer times. Therefore, it is conceived that if the range where Li concentration shows a profile of variation extends as deep as 70 μm from the substrate surface in the thickness direction, then the substrate can exhibit sufficiently practical temperature characteristic and it can be possible to minimize the warpage, and the occurrences of breakage and crack.

Example 6

In Example 6, at first, a singly polarized 4-inch diameter lithium niobate single crystal ingot having a roughly congruent composition wherein the Li:Nb ratio was 48.5:51.5 was sliced into wafers, and the Z cut and 41° rotation Y cut lithium niobate substrates having a thickness of 300 μm were obtained. Thereafter, depending on the requirements, the surface roughness of each sliced wafer was adjusted to 0.15 μm in terms of Ra measure through a lapping process, and the final thickness was rendered 250 μm.

Next, some of the substrates were plane-polished on one side, which was rendered 0.01 μm in Ra measure to turn to be semi-mirror face, and these substrates were buried in a powder based on Li, Nb and O and having $Li_3NbO_4$ as the principal ingredient. The powder having $Li_3NbO_4$ as the principal ingredient used on this occasion was obtained by mixing powders of $Li_2CO_3$ and $Nb_2O_5$ at a molar ratio of 7:3, and then baking the mixture at 1000° C. for 12 hours. Then this powder having $Li_3NbO_4$ as the principal ingredient was laid in a small container and the sliced wafers were buried in the powder of $Li_3NbO_4$.

Next, this small container was set in an electric furnace, and the atmosphere inside the furnace was made to be of $N_2$, and the heating at 900° was conducted for 36 hours to thereby effect diffusion of Li through the surface into the middle portion of the sliced wafer whereby the roughly congruent composition was changed to a pseudo stoichiometric composition. Also, the sliced substrate thus treated was subjected to an annealing treatment for 12 hours in $N_2$ at a temperature of 750° C., which is above the Curie temperature.

Further, the coarse side face of the substrate was finished to have an Ra value of about 0.15 μm with sand blast, and the semi-mirror face was polished by 3 μm to yield a number of lithium niobate single crystal substrates. Although, these substrates were exposed to a temperature above the Curie temperature on this occasion, no singly polarizing treatment was conducted on these substrates.

With respect to one of the substrates thus manufactured, a measurement was made of the value of half-value width of Raman shift peak in the vicinity of 876 cm$^{-1}$, which is an indicator of Li diffusion amount, shifting the measuring point in depth-wise direction from the surface; and it was found that this substrate had different Raman half-value widths between its surface and its inside part, and had a range from about 5-μm depth through about 50-μm depth where the Raman half-value width value decreased as the measuring point approached the substrate surface, and the Raman half-value width value increased as the measuring point approached the middle of the substrate Also, the Raman half-value width at the substrate surface was 17.8 cm$^{-1}$, and the Raman half-value width at the thickness-wisely middle part of the substrate was 23.0 cm$^{-1}$. Now, it can be understood in this case that Li concentration started increasing at a depth of 62 μm or smaller so that the middle position of the substrate in the thickness direction was determined to lie at the depth of 62 μm. Therefore, the difference between the Raman half-value width value at the substrate surface and the Raman half-value width value at the thickness-wisely middle part of the substrate was 5.2 cm$^{-1}$.

From the above result, it was confirmed in Example 6 that there occurred a difference in Li concentration between the substrate surface and the inner part of the substrate and that the substrate had a range extending in its depth direction from about 5-μm depth through about 60 μm depth in which a concentration profile is established such that the closer the measuring point is to the substrate surface, the higher the Li concentration becomes, and the closer the measuring point is to the middle of the substrate, the lower the Li concentration becomes.

Also, the Raman half-value width in the range from the substrate surface to the depth of 5 μm in the thickness direction was about 17.8 cm$^{-1}$, so that using Equation (3) below, the composition in that range becomes such that Li/(Li+Nb)=0.500, and thus it was found that a pseudo stoichiometric composition was established.

$$Li/(Li+Nb)=(53.29-0.1837FWHM_3)/100 \quad (3)$$

Next, since Raman half-value width at the thickness-wisely middle part of the substrate was about 23.0-23.8 cm$^{-1}$, the same Equation (3) gives the value of Li/(Li+Nb) to be 0.489-0.491 and hence it was found that a roughly congruent composition was established.

Next, the warpage of the 4-inch substrate to which the Le diffusion had been effected was measured by means of laser beam interference method, and the resultant value was as small as 50 μm, and no breakage or cracking were observed. Furthermore, these lithium tantalate single crystal substrates were heated in a hot plate, and when the surface potential was measured, the resulting voltage was 0 V, so that it was confirmed that the substrates of Example 6 would not show pyroelectricity in their surfaces even after they are subjected to a heat treatment.

Also, a small piece was cut out each from the Z cut and 41° Y cut, and, in a Piezo d33/d15 meter (model ZJ-3BN) manufactured by The Institute of Acoustics of the Chinese Academy of Sciences, each small piece was given a vertical vibration in the thickness direction to their principal face and also to their back face respectively to observe the voltage waveform thereby induced, and the voltage was observed to be 0 V and the piezoelectric constant d33 was zero too. Similarly, using d15 unit of the same apparatus, each small piece was given a vibration in the shearing direction to their principal face and also to their back face respectively to observe the voltage waveform thereby induced, a waveform representing piezoelectricity was obtained. These pieces were hit with the end of the probe of a synchro scope for observation of piezoelectric response, and a waveform representing a piezoelectric response was observed. Therefore, having piezoelectricity, the substrates of Example 6 were confirmed to be usable for surface acoustic wave device.

Next, after removing from the surface of one face of each piece a thickness of 60 μm by means of hand lapping, each piece was hit with the end of the probe of a synchro scope for observation of piezoelectric response, and the piezoelectric response observed had a smaller voltage than in the above-described case. Then from the other face of each piece a thickness of 60 μm was removed by hand lapping, and each piece was hit with the end of the probe of a synchro scope for observation, and no piezoelectric response was observed.

Also, with respect to this piece, a vertical vibration in the thickness direction was given to its principal face and also to its back face respectively by the d33/d15 meter to observe the voltage waveform thereby induced, and the voltage was observed to be 0 V and the piezoelectric constant d33 was observed zero too. Similarly, using d15 unit of the same apparatus, the piece was given a vibration in the shearing direction to its principal face and also to its back face respectively, and it was observed that the voltage waveform thereby induced did not indicate piezoelectricity, and the voltage was 0 V.

Therefore, it was confirmed from this result that the substrates of Example 6 had their surface layer, which covers from the surface through the depth of 60 μm, modified to have pseudo stoichiometric composition and therefore exhibit piezoelectricity; whereas that part of each substrate which is 60 μm or deeper did not exhibit piezoelectricity, and hence the thickness-wisely central vicinities are confirmed to be of multi-domain structure, where polarization directions are not oriented in one direction.

Next, the 4-inch 41° Y cut lithium niobate single crystal substrate, which had received the Li diffusion treatment and the annealing treatment and had been polished, was subjected to a sputtering treatment whereby the surface of the substrate was covered with 0.05-μm-thick Al film. Thereafter, a resist was applied to the thus sputtered substrate; then in an aligner, the substrate was exposed and developed with a pattern of a SAW resonator and a ladder filter, and a patterning for evaluation of its SAW characteristic was given to the substrate by means of RIE. The length of one wave of the SAW electrode thus patterned was set to 4.8 μm.

Then, in this SAW resonator a series resonant type resonator and a parallel resonant type resonator, to each of which an input-output terminal was provided, were formed, and their SAW waveform characteristics were examined by means of an RF prober, and the result confirmed that the substrate of Example 6 too exhibits a good SAW waveform characteristic desirable for its use with a surface acoustic wave device.

Then, varying a stage temperature from about 16° C. through 70° C., the temperature coefficient of the antiresonance frequency and that of the resonance frequency were examined, and the results obtained in Example 6 show that the temperature coefficient of antiresonance frequency was −34 ppm/° C., and the temperature coefficient of resonance frequency was −50 ppm/° C., so that the average frequency temperature coefficient was −42 ppm/° C. Also, for the purpose of comparison, it was obtained that, in the case of the 41° Y cut lithium niobate single crystal substrate to which no Li diffusion treatment was applied, the temperature coefficient of this substrate was such that the temperature coefficient of antiresonance frequency was −56 ppm/° C., and temperature coefficient of resonance frequency was −72 ppm/° C., so that the average frequency temperature coefficient was −64 ppm/° C.

Therefore, the substrate of Example 6 had a smaller average frequency temperature coefficient than the substrate which had not received Li diffusion treatment, and the substrate underwent smaller property changes with temperature, so that it was confirmed that it has a good temperature characteristic.

COMPARATIVE EXAMPLES

Next, we will explain about Comparative Example 1 in contrast to Example 1, and this Comparative Example 1 is an example described in IP Publication 5 wherein a substrate having a finishing thickness of 550 μm is subjected to a gas phase treatment at a temperature as high as 1250° C. for 60 hours; detailed explanation follows.

Comparative Example 1

In Comparative Example 2, similarly as in Example 1, lithium tantalate single crystal substrates of a roughly congruent composition were sliced from a Z cut and 38.5° rotation Y cut single crystal ingot to have a thickness of 600 μm, which is greater than that adopted in Example 1; thereafter, similarly as in Example 1, the surface roughness of the slices was adjusted to 0.15 μm in terms of Ra measure through a lapping process and the finishing thickness became 550 μm. Also, the substrates were plane-polished on one side, which was rendered 0.01 μm in Ra measure to turn to be a semi-mirror face.

An Li diffusion was effected by means of a vapor phase treatment in a furnace wherein the atmosphere was the atmospheric air and the temperature and the treatment time were 1250° C. and 60 house, respectively, which were higher and longer than those in the case of Example 1, and thus Li was caused to diffuse from the substrate surface toward the middle part and the roughly congruent composition was changed to pseudo stoichiometric composition. Then, after this Li diffusion treatment, the substrates were subjected to an annealing treatment and a finish polishing process, which were the same as those in Example 1, and a plurality of lithium tantalate single crystal substrates for surface acoustic wave device were obtained. On this occasion, these substrates were exposed to a temperature higher than the Curie temperature but the singly polarizing treatment was not conducted on these substrates.

With respect to one of the substrates thus manufactured, a measurement was made to obtain a profile of Li concentration in the depth direction starting from the surface, and it was found that the Raman half-value width, which represents Li concentration, was 6.0 cm$^{-1}$ and this value of Li concentration was constantly obtained from the surface thought to the middle part so that the profile obtained was uniform and represented a crystalline structure.

Also, this 4-inch substrate had come to have a substantial deformation so that it was not possible to measure the deformation by means of laser beam interference method, and the warpage was measured with a laser displacement sensor and the warpage was as large as 1500 μm and some scratched lines were observed on the substrate. Further, this substrate was heated in a hot plate and its surface potential was measured and the obtained voltage was 1 kV.

Next, a small piece was cut out each from the Z cut and 38.5° Y cut, and, similarly as in Example 1, each small piece was given a vertical vibration in the thickness direction to the principal face and also to the back face respectively to observe the voltage waveform thereby induced, and the voltage waveform observed was a kind that represents piezoelectricity; also the waveform induced when a vibration in the shearing direction was given to the principal face and also to the back face respectively was the kind representing piezoelectricity. This Z cut and 38.5° Y cut piece was hit with the end of the probe of a synchro scope and a waveform representing a piezoelectric response was observed.

Also, after removing from one face of the piece a thickness of 50 μm by means of hand lapping, the piece was hit with the end of the probe of a synchro scope, and again a similar waveform representing the piezoelectric response was obtained. Then from the other face of this piece a thickness of 50 μm was removed by hand lapping, and the piece was hit with the end of the probe of the synchro scope, and a similar waveform representing the piezoelectric response was obtained.

From the above results, it was confirmed that since in the method of Comparative Example 1 the Li diffusion treatment was conducted at a higher temperature and for a longer period of time than in the case of Example 1, the diffusion of Li ion progressed farther than the depth of 50 μm from the surface layer toward the middle part so that the substrate came to have a crystal structure of a pseudo stoichiometric composition which would give a uniform Li concentration profile extending to the thickness-wisely middle part.

Next, a trial was made to observe the SAW waveform characteristic by subjecting the surface of a 4-inch 38.5° Y cut lithium tantalate single crystal substrate, to which an Li diffusion treatment, an annealing treatment and a polishing process had been applied, to the same treatments as in the case of Example 1; however, this substrate had such a large warpage that no patterning was produced.

Therefore, from this result, it was confirmed that if Li diffusion treatment is conducted at as high a temperature as 1250° C. for a period of no less than 60 hours, as done in Comparative Example 1, although it is possible to obtain a crystal structure wherein, as the result of denaturing, such a pseudo stoichiometric composition is established that the Li concentration profile is uniform from the surface layer to the middle part, the adoption of the high temperature and the long treatment time cause large warpage and scratched lines on the substrate surface.

The invention claimed is:

1. A piezoelectric oxide single crystal substrate comprising a piezoelectric oxide single crystal, wherein the piezoelectric oxide single crystal has a Li concentration profile such that a concentration at a substrate surface is different from that at an inner part of the substrate, wherein the value of a Raman shift peak half-value width at the substrate surface and that at the middle part of the substrate are different, and the difference between the value of the half-value width of Raman shift peak at the substrate surface and that in the thickness-wisely middle part of the substrate is 1.0 cm$^{-1}$ or greater.

2. The piezoelectric oxide single crystal substrate as claimed in claim 1, wherein said concentration profile is such that Li concentration becomes higher as the measurement point approaches the substrate surface and it becomes lower as the measurement point approaches a thickness-wisely middle part of the substrate.

3. The piezoelectric oxide single crystal substrate as claimed in claim 1, wherein said concentration profile extends from said substrate surface to a depth of 70 µm in thickness direction.

4. The piezoelectric oxide single crystal substrate as claimed in claim 1, wherein the composition in the range between the substrate surface and a depth at which the Li concentration starts decreasing or at which the Li concentration stops increasing is of a pseudo stoichiometric composition.

5. The piezoelectric oxide single crystal substrate as claimed in claim 1, wherein the thickness-wisely middle part of the substrate has a roughly congruent composition.

6. The piezoelectric oxide single crystal substrate as claimed in claim 1, wherein a depth at which the Li concentration starts increasing or a depth at which the Li concentration stops decreasing is deeper than 5 µm from the substrate surface in the thickness direction.

7. The piezoelectric oxide single crystal substrate as claimed in claim 1, wherein said substrate has a profile of the Raman shift peak half-value width such that, in the direction of substrate thickness, the closer the measuring point is to the substrate surface, the smaller the value of Raman shift peak half-value width becomes, and the closer the measuring point is to the middle part of the substrate, the greater the value of the half-value width becomes.

8. The piezoelectric oxide single crystal substrate as claimed in claim 1, wherein said substrate is made of lithium tantalate single crystal and that the value of the half-value width of Raman shift peak near 600 $cm^{-1}$ at the substrate surface is 6.0-8.3 $cm^{-1}$.

9. The piezoelectric oxide single crystal substrate as claimed in claim 1, wherein said substrate is made of lithium niobate single crystal and that the value of the half-value width of Raman shift peak near 876 $cm^{-1}$ at the substrate surface is 17.0-23.4 $cm^{-1}$.

10. The piezoelectric oxide single crystal substrate as claimed in claim 1, wherein said substrate has a multi-domain structure, where polarization directions are not oriented in one direction, in the vicinity of the thickness-wisely middle position.

11. The piezoelectric oxide single crystal substrate as claimed in claim 1, wherein said substrate does not exhibit pyroelectric nature at its surface.

12. The piezoelectric oxide single crystal substrate as claimed in claim 1, wherein a voltage waveform that is induced when a vertical vibration is given in the thickness direction to the principal surface or the back surface of the substrate is zero, and that a voltage waveform that is induced when a vibration in the shearing direction is given to the principal surface or the back surface of the substrate exhibits piezoelectricity.

13. The piezoelectric oxide single crystal substrate as claimed in claim 1, wherein the piezoelectric oxide single crystal substrate has a Y-cut crystal orientation at the rotation angle of 36-49°.

14. The piezoelectric oxide single crystal substrate as claimed in claim 1, wherein the thickness of the substrate is 0.2 mm through 0.4 mm.

15. The piezoelectric oxide single crystal substrate as claimed in claim 1, wherein the substrate has a warpage of 100 µm or less.

16. The piezoelectric oxide single crystal substrate as claimed in claim 1, wherein said single crystal substrate is manufactured by effecting a gas-phase Li diffusion from the substrate surface to the inside of the oxide single crystal substrate of a roughly congruent composition already subjected to a single polarization treatment.

* * * * *